(12) United States Patent
Yamazaki et al.

(10) Patent No.: US 6,329,229 B1
(45) Date of Patent: *Dec. 11, 2001

(54) METHOD FOR PROCESSING SEMICONDUCTOR DEVICE, APPARATUS FOR PROCESSING A SEMICONDUCTOR AND APPARATUS FOR PROCESSING SEMICONDUCTOR DEVICE

(75) Inventors: Shunpei Yamazaki, Tokyo; Hiroyuki Shimada, Kanagawa; Akira Takenouchi, Kanagawa; Yasuhiko Takemura, Kanagawa, all of (JP)

(73) Assignee: Semiconductor Energy Laboratory Co., Ltd., Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/962,841

(22) Filed: Nov. 3, 1997

Related U.S. Application Data

(60) Continuation of application No. 08/474,675, filed on Jun. 7, 1995, now abandoned, which is a division of application No. 08/330,797, filed on Oct. 28, 1994, now abandoned.

(30) Foreign Application Priority Data

Nov. 5, 1993 (JP) .................................... 5-301172
Apr. 13, 1994 (JP) .................................... 6-100642

(51) Int. Cl.[7] ...................... H01L 21/336; H01L 21/324
(52) U.S. Cl. ...................... 438/166; 438/162; 438/486; 438/487
(58) Field of Search ................... 438/151, 166, 438/162, 165, 477, 486, 487, 795

(56) References Cited

U.S. PATENT DOCUMENTS

| | | |
|---|---|---|
| T954,009 | 1/1977 | Malin et al. . |
| 4,113,514 | * 9/1978 | Pankove et al. . |
| 4,151,007 | * 4/1979 | Levinstein et al. . |
| 4,151,058 | 4/1979 | Kaplan et al. . |
| 4,226,898 | 10/1980 | Ovshinsky et al. . |

(List continued on next page.)

FOREIGN PATENT DOCUMENTS

| | | | |
|---|---|---|---|
| 0 211 634 | 2/1987 | (EP) . | |
| 53-26584 | * 3/1978 | (JP) | ........................................ 437/21 |
| 53-026584 | 3/1978 | (JP) . | |
| 57-194518 | 11/1982 | (JP) . | |
| 60-042817 | 3/1985 | (JP) . | |

(List continued on next page.)

OTHER PUBLICATIONS

Wolf et al., "Silicon Processing for the VLSI Era," vol. 1, pp. 61–65 (1986).

Wolf, "Silicon Processing For the VLSI Era," vol. 3, p. 648 (1995).

(List continued on next page.)

Primary Examiner—Mary Wilozewski
(74) Attorney, Agent, or Firm—Eric J. Robinson; Nixon & Peabody LLP

(57) ABSTRACT

A multi-chamber system for providing a process of a high degree of cleanliness in fabricating semiconductor devices such as semiconductor integrated circuits. The system comprises a plurality of vacuum apparatus (e.g., a film formation apparatus, an etching apparatus, a thermal processing apparatus, and a preliminary chamber) for fabrication of semiconductor devices. At least one these vacuum apparatuses is a laser.

32 Claims, 10 Drawing Sheets

U.S. PATENT DOCUMENTS

| | | |
|---|---|---|
| 4,313,783 | 2/1982 | Davies et al. . |
| 4,322,253 | 3/1982 | Pankove et al. . |
| 4,331,709 * | 5/1982 | Risch et al. . |
| 4,370,175 | 1/1983 | Levatter . |
| 4,388,145 | 6/1983 | Hawkins et al. . |
| 4,398,343 * | 8/1983 | Yamazaki . |
| 4,402,762 | 9/1983 | John et al. . |
| 4,405,435 | 9/1983 | Tateishi et al. . |
| 4,475,027 | 10/1984 | Pressley . |
| 4,482,395 | 11/1984 | Hiramoto . |
| 4,498,416 | 2/1985 | Bouchaib . |
| 4,503,807 | 3/1985 | Nakayama et al. . |
| 4,505,950 | 3/1985 | Yamazaki . |
| 4,523,370 | 6/1985 | Sullivan et al. . |
| 4,552,595 | 11/1985 | Hoga . |
| 4,557,036 | 12/1985 | Kyuragi et al. . |
| 4,567,061 | 1/1986 | Hayashi et al. . |
| 4,576,851 | 3/1986 | Iwamatsu . |
| 4,582,720 | 4/1986 | Yamazaki . |
| 4,589,951 | 5/1986 | Kawamura . |
| 4,590,091 | 5/1986 | Rogers, Jr. et al. . |
| 4,592,306 | 6/1986 | Gallego . |
| 4,592,799 | 6/1986 | Hayafuji . |
| 4,595,601 | 6/1986 | Horioka et al. . |
| 4,609,407 | 9/1986 | Masao et al. . |
| 4,640,223 | 2/1987 | Dozier . |
| 4,663,829 * | 5/1987 | Hartman et al. ............... 437/101 |
| 4,675,978 * | 6/1987 | Swartz ............................. 437/21 |
| 4,694,143 | 9/1987 | Nishimura et al. . |
| 4,698,486 | 10/1987 | Sheets . |
| 4,699,863 | 10/1987 | Sawatari et al. . |
| 4,719,123 | 1/1988 | Haku et al. . |
| 4,800,174 * | 1/1989 | Ishihara et al. ............... 437/101 |
| 4,808,554 * | 2/1989 | Yamazaki ...................... 437/101 |
| 4,843,022 | 6/1989 | Yamazaki . |
| 4,888,305 * | 12/1989 | Yamazaki et al. ............. 437/101 |
| 4,937,205 * | 6/1990 | Nakayama et al. ............ 437/165 |
| 4,951,601 | 8/1990 | Maydan et al. . |
| 4,986,213 | 1/1991 | Yamazaki et al. . |
| 4,988,642 * | 1/1991 | Yamazaki et al. ............. 437/101 |
| 5,028,560 * | 7/1991 | Tsukamoto et al. ........... 437/239 |
| 5,043,299 | 8/1991 | Chang et al. . |
| 5,091,334 | 2/1992 | Yamazaki et al. . |
| 5,141,058 | 8/1992 | Heppner . |
| 5,147,826 | 9/1992 | Liu . |
| 5,171,710 | 12/1992 | Yamazaki et al. . |
| 5,174,881 * | 12/1992 | Iwasaki et al. ................. 118/719 |
| 5,186,718 * | 2/1993 | Tepman et al. ................ 29/25.01 |
| 5,194,398 * | 3/1993 | Miyachi et al. ................ 437/101 |
| 5,200,017 * | 4/1993 | Kawasaki et al. ............. 118/719 |
| 5,266,116 * | 11/1993 | Fujioka et al. ................. 118/719 |
| 5,286,296 | 2/1994 | Sato et al. . |
| 5,288,658 * | 2/1994 | Ishihara .......................... 437/101 |
| 5,292,393 | 3/1994 | Maydan et al. . |
| 5,292,675 * | 3/1994 | Codama .......................... 437/21 |
| 5,294,571 * | 3/1994 | Fujishiro et al. ............... 437/239 |
| 5,294,572 | 3/1994 | Granneman et al. . |
| 5,294,811 | 3/1994 | Aoyama et al. . |
| 5,296,405 | 3/1994 | Yamazaki et al. . |
| 5,298,436 * | 3/1994 | Radosevich et al. ........... 437/233 |
| 5,304,357 | 4/1994 | Sato et al. . |
| 5,308,998 | 5/1994 | Yamazaki et al. . |
| 5,310,410 * | 5/1994 | Begin et al. .................... 118/719 |
| 5,313,076 | 5/1994 | Yamazaki et al. . |
| 5,314,538 * | 5/1994 | Maeda et al. ................... 29/25.01 |
| 5,314,839 | 5/1994 | Mizutani et al. . |
| 5,322,807 * | 6/1994 | Chen et al. ..................... 437/41 TFT |
| 5,324,360 * | 6/1994 | Kozuka ........................... 118/719 |
| 5,352,291 * | 10/1994 | Zhang et al. . |
| 5,372,958 | 12/1994 | Miyasaka . |
| 5,380,682 | 1/1995 | Edwards et al. . |
| 5,412,493 * | 5/1995 | Kunii et al. .................... 437/41 TFT |
| 5,413,664 | 5/1995 | Yagi et al. . |
| 5,420,044 | 5/1995 | Kozuka . |
| 5,422,287 * | 6/1995 | So ................................... 437/21 |
| 5,424,244 * | 6/1995 | Zhang et al. . |
| 5,478,780 | 12/1995 | Koerner et al. . |
| 5,494,494 | 2/1996 | Mizuno et al. . |
| 5,561,081 | 10/1996 | Takenouchi et al. . |
| 5,578,520 * | 11/1996 | Zhang et al. .................... 437/81 |
| 5,581,092 | 12/1996 | Takemura . |
| 5,595,638 | 1/1997 | Konuma et al. . |
| 5,608,232 | 3/1997 | Yamazaki et al. . |
| 5,608,251 | 3/1997 | Konuma et al. . |
| 5,620,095 | 4/1997 | Konuma et al. . |
| 5,620,905 | 4/1997 | Konuma et al. . |
| 5,639,698 | 6/1997 | Yamazaki et al. . |
| 5,643,801 | 7/1997 | Ishihara . |
| 5,663,077 | 9/1997 | Adachi et al. . |
| 5,753,542 | 5/1998 | Yamazaki et al. . |
| 5,804,471 | 9/1998 | Yamazaki et al. . |
| 5,840,600 * | 11/1998 | Yamazaki et al. .............. 438/151 |
| 5,849,043 | 12/1998 | Zhang . |
| 5,858,473 | 1/1999 | Yamazaki . |
| 5,861,337 | 1/1999 | Zhang . |
| 5,879,969 * | 3/1999 | Yamazaki et al. .............. 438/151 |
| 5,965,904 | 10/1999 | Ohtani et al. . |
| 5,966,594 | 10/1999 | Adachi et al. . |

FOREIGN PATENT DOCUMENTS

| | | |
|---|---|---|
| 60-066471 | 4/1985 | (JP) . |
| 62-54423 | 3/1987 | (JP) . |
| 62-54448 | 3/1987 | (JP) . |
| 62-104117 | 5/1987 | (JP) . |
| 63-160336 | 7/1988 | (JP) . |
| 63-250178 | 10/1988 | (JP) . |
| 01-057615 | 3/1989 | (JP) . |
| 64-076715 | 3/1989 | (JP) . |
| 64-076737 | 3/1989 | (JP) . |
| 01-128446 | 5/1989 | (JP) . |
| 01-179410 | 7/1989 | (JP) . |
| 02-073623 | 3/1990 | (JP) . |
| 02-081424 | 3/1990 | (JP) . |
| 02-239615 | 9/1990 | (JP) . |
| 02-255292 | 10/1990 | (JP) . |
| 02-257619 | 10/1990 | (JP) . |
| 03-024717 | 2/1991 | (JP) . |
| 03-082121 | 4/1991 | (JP) ............................ H01L/21/302 |
| 03-286518 | 12/1991 | (JP) . |
| 3-289140 * | 12/1991 | (JP) ...................................... 437/21 |
| 03-289140 | 12/1991 | (JP) . |
| 03-293719 | 12/1991 | (JP) . |
| 04-102375 | 4/1992 | (JP) . |
| 4-102375 * | 4/1992 | (JP) ............................... 437/41 TFT |
| 04-152624 | 5/1992 | (JP) . |
| 04-206532 | 7/1992 | (JP) . |
| 04-240733 | 8/1992 | (JP) . |
| 04-251921 | 9/1992 | (JP) ............................ H01L/21/285 |
| 04-307727 | 10/1992 | (JP) . |
| 04-373178 | 12/1992 | (JP) . |
| 05-182923 | 7/1993 | (JP) . |
| 05-206063 | 8/1993 | (JP) ............................ H01L/21/285 |
| 05-243577 | 9/1993 | (JP) . |
| 05-251342 | 9/1993 | (JP) . |
| 05-254984 | 10/1993 | (JP) . |
| 06-084944 | 3/1994 | (JP) . |
| 07-099321 | 4/1995 | (JP) . |

OTHER PUBLICATIONS

Sekiya et al., "Extended Abstracts (The 41st Spring Meeting, 1994); The Japan Society of Applied Physics and Related Societies" No. 2, 1994, p. 618. Translation for "High Performance Poly–Si TFT Fabricated Using Remote Plasma CVD of $SiO_2$ ", Sony Corp. Research Center, M. Sekiya et al. (Full English Translation).

Sekiya et al., "Extended Abstracts (The 41st Spring Meeting, 1994); The Japan Society of Applied Physics and Related Societies" No. 2, 1994, p. 618.

Kawachi et al., "Large–Area Doping Process for Fabrication of Poly–Si Thin Film Transistors Using Bucket Ion Source and XeCl Excimer Laser Annealing", Dec. 1990, pp. L2370–L2372, Jap. J. of Appl. Phys., vol. 24, No. 12.

Sameshima et al., "XeCl Excimer Laser Annealing Used To Fabricate Poly–Si TFT's", Oct. 1989, pp. 1789–1793, Japanese J. of Appl Phys. vol. 28, No. 10.

Wagner et al., "Formation of p–n Junctions & Silicides in Silicon Using a High Performance Laser Beam Homogenization System", 1989, pp. 260–263, Applied Surface Science 43, North Holland.

Sera et al., "High–Performance TFT's Fabricated by XeCl Excimer Laser Annealing of Hydrogenated Amorphous–Silicon Film", Dec. 1989, pp. 2868–2872, IEEE Transactions on Elecrton Devices, Col. 36, No. 12.

Kuwano et al., "Photovoltaic Behavior of Amorphous Si:H and Si:F:H Solar Cells", Published Aug. 1981, May 12–15, 1981, Conference Record, 15th IEEE Photovoltaic Specialists Conf., Kissimmee, Florida, USA.

Wolf, "Silicon Processing for the VLSI Era, vol. 1: Process Technology", Jan. 1986, pp. 57–58, Lattice Press.

Wolf et al., "Silicon Processing for the VLSI Era, vol. 3: The Submicron Effect", Oct. 1985, pp. 502–504, Lattice Press, California.

Nulman et al., "Rapid Thermal Processing of Thin Gate Dielectrics", May 1985, pp. 205–207, IEEE Electron Device Letters, vol. 6, No. 5.

Jhon et al., "Crystallization of Amorphous Silicon by Excimer Laser Annealing with a Line Shape Beam Having a Gaussian Profile",1994, pp. L1438–L1441, Japanese J. of Appl. Phys., vol. 33.

* cited by examiner

LASER LIGHT

PTFT   NTFT

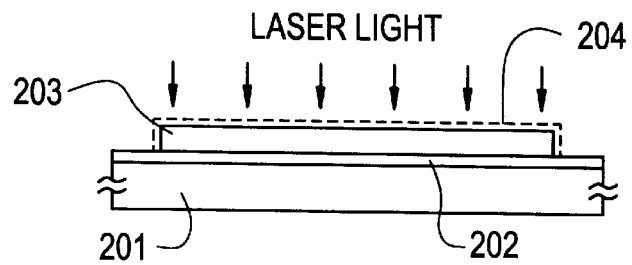
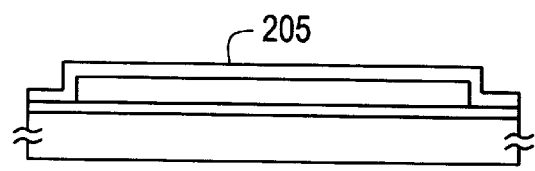
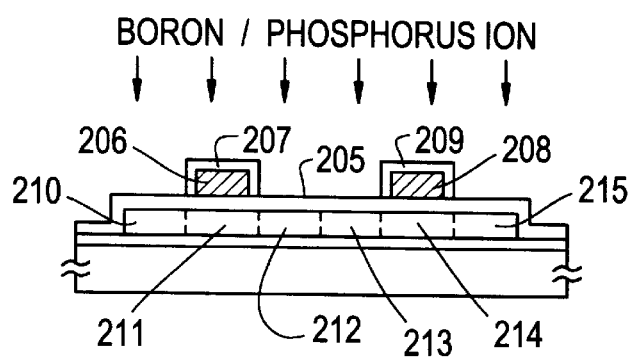
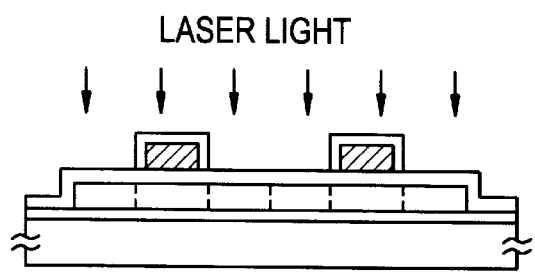
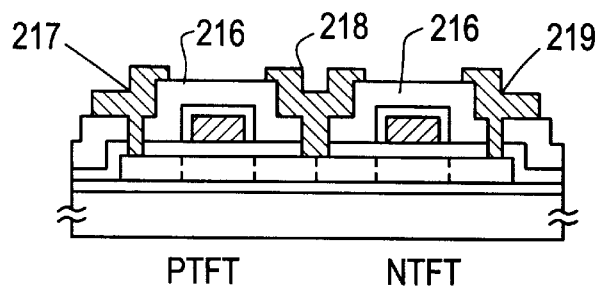

LASER LIGHT

PTFT       NTFT

METHOD FOR PROCESSING SEMICONDUCTOR DEVICE, APPARATUS FOR PROCESSING A SEMICONDUCTOR AND APPARATUS FOR PROCESSING SEMICONDUCTOR DEVICE

This application is a Continuation of Ser. No. 08/474,675, filed Jun. 7, 1995, now abandoned; which itself is a divisional application of Ser. No. 08/330,797, filed Oct. 28, 1994, abandoned.

FIELD OF THE INVENTION

The present invention relates to a method and apparatus for fabricating semiconductor devices such as various transistors and integrated circuits.

BACKGROUND OF THE INVENTION

In recent years, methods and apparatus which use lasers to manufacture semiconductor devices have been developed. Examples of these methods and apparatus include laser etching, or laser scribing, in which films are etched and patterned, laser annealing in which the crystalline state of films or their surfaces are changed by laser irradiation, and laser doping in which an impurity is diffused into films or their surfaces by laser irradiation within an ambient containing the impurity.

In these conventional semiconductor fabrication methods using lasers, a substrate already processed by other film formation apparatus or etching apparatus is first placed in position inside a laser processing apparatus. The inside of this apparatus is evacuated and the substrate is heated and then the substrate is processed by laser radiation. Consequently, the productivity is very low.

SUMMARY OF THE INVENTION

It is a object of the present invention to provide a method of fabricating semiconductor devices with improved productivity.

It is another object of the invention to provide an apparatus capable of fabricating semiconductor devices with improved productivity.

An apparatus according to the present invention comprises a multi-chamber system consisting of a film formation apparatus (e.g., a plasma CVD apparatus, a sputtering apparatus, a thermal CVD apparatus, or a vacuum evaporation apparatus), an etching apparatus, a doping apparatus (e.g., a plasma doping apparatus or an ion implanter), a thermal processing apparatus (e.g., a thermal diffusion apparatus or a thermal crystallization apparatus), vacuum apparatus such as a preliminary chamber, and a laser processing apparatus (e.g., a laser etching apparatus, a laser annealing apparatus, or a laser doping apparatus). The novel apparatus performs processing without exposing each substrate to the atmosphere at all. In this system, the evacuation an be effected in a greatly shortened time. In addition, when the substrate is transported, it is protected from contamination.

Also, various annealing methods making use of infrared light irradiation rather than laser irradiation are available. For example, an amorphous silicon film formed on a glass substrate is crystallized by heating and then irradiated with infrared radiation. As a result, the crystallinity can be enhanced further. Infrared radiation is absorbed more readily by the thin silicon film than by the glass substrate. Only the thin silicon film can be heated without heating the glass substrate very much. This is advantageous. Furthermore, it is considered that the obtained effect is comparable to the effect produced by a thermal anneal conducted above 1000° C.

An anneal using such irradiation of infrared radiation can be completed within several minutes. Therefore, this is known as a rapid thermal anneal (RTA). This anneal can be advantageously conducted after an insulating film is formed on a semiconductor layer. In this case, the level in the interface between the semiconductor layer and the insulating film can be reduced, so that the interface characteristics can be enhanced. For example, after an active layer (in which a channel formation layer is formed) for an insulated-gate field-effect transistor is formed, a silicon oxide film becoming a gate-insulating film is formed. Subsequently, a rapid thermal anneal process is carried out. In this way, he characteristics at and around the interface between the channel and the gate-insulating film which are an important factor for the insulated-gate field-effect transistor can be improved.

A semiconductor processing system in accordance with another aspect of the present invention comprises:
  at least one processing apparatus for irradiating laser light or other light (e.g. an infrared light) as strong as laser light;
  at least one vacuum film formation apparatus (evacuable chamber) by vapor phase deposition method (for example, plasma CVD apparatus low pressure CVD (LPCVD) apparatus, atmospheric pressure CVD (APCVD) apparatus, sputtering film formation apparatus (sputter apparatus) and the like),
  wherein laser light or strong light is irradiated to a non-single crystal semiconductor film such as an amorphous semiconductor film, a poly-crystal semiconductor film, a micro-crystal semiconductor film formed on a substrate in the processing apparatus for irradiating laser light or other light as strong as laser light;
  wherein said substrate is transferred from said processing apparatus for irradiating laser light or another light as strong as laser light to another evacuable chamber without being exposed to outside air, and prescribed process is performed;
  said irradiation of laser light or other light as strong as laser light being performed in oxidizing atmosphere such as oxygen atmosphere, or in nitrogenizing (nitriding) atmosphere such as ammonia atmosphere, thus improving crystal character of the non-single crystal semiconductor film, performing oxidation of its surface or formation of an oxide film on the surface (in the case of oxidizing atmosphere), or performing nitrogenization of its surface or formation of a nitride film on the surface (in the case of nitrogenizing atmosphere). The semiconductor processing system has a means for transferring an object from the light processing chamber to the evacuable chamber, or vice versa without exposing the object to air.

It is necessary that the processing apparatus for irradiating laser light or other light as strong as laser light has function of irradiating laser light or other light as strong as laser light, has a means of introducing a gas needed, and has an exhaustion means of making the atmosphere low pressure. Excimer laser, YAG laser of various types, ruby laser and the like can be utilized as laser light. As non-coherent light source other than laser, rare gas lamp such as xenon lamp or krypton lamp, halogen lamp and the like can be utilized. A wide range of wavelength from infrared light to ultraviolet light can be utilized as wavelength of light source. To prevent temperature increase of the substrate, it is preferable light irradiation is performed in pulses. It is desirable that the pulse width is 1 μsec or less.

As a vacuum film formation apparatus, a plasma CVD apparatus, a low pressure CVD (LPCVD) apparatus, an atmospheric pressure CVD (APCVD) apparatus, or a sputtering film formation apparatus (a sputter apparatus) can be utilized.

Other than above mentioned apparatuses as a vacuum processing apparatus, a heating process apparatus (a heat-treatment chamber) in each type of atmosphere, an ion injection apparatus, an etching chamber, an apparatus for carrying substrates in and our can be connected. It is preferable each of these apparatuses has a gas introducing system and a gas exhaustion system for gas needed by each. It is preferable these apparatuses are connected to a common transportation chamber which exclusively transports substrates.

Substrates are transported without being exposed to the outside air so that things to be processed (for example, a silicon film on a substrate) would not be polluted in each process.

A method in accordance with the present invention comprises:

irradiating laser light or other light as strong as laser light to a non-single crystal semiconductor film in nitrogenizing or oxidizing atmosphere, thus nitrogenizing or oxidizing the non-single crystal semiconductor surface and improving crystal character of said non-single crystal semiconductor film; and depositing an insulating film on the oxide film or the nitride film.

An amorphous silicon film deposited by a plasma CVD method or a low-pressure heat CVD method can be utilized as the non-single crystal semiconductor film. By annealing an amorphous semiconductor film like this at 650° C. or less, crystallized polycrystal or microcrystal semiconductor film can be also utilized. Laser light or other light as strong as laser light is irradiated in nitrogenizing or oxidizing atmosphere in order to form a nitride film, an oxide film or an oxinitride film on the surface of these non-single crystal semiconductor films, and in order to improve crystal character of the non-single crystal semiconductor film. Oxidizing atmosphere is atmosphere including oxidizing function to perform oxidation effectively. This is atmosphere including dinitrogen monoxide ($N_2O$) and nitrogen dioxide ($NO_2$) and the like a lot, or atmosphere of mixture with these and oxygen and the like. Therefore this atmosphere is different from atmosphere simply including these gas in a small amount. Chlorine, trichloroethylene, (trichlene, TCE, $CHCl=CCl_2$), trans-1,2-dichloroethylene ($CHCl=CHCl$) can be included in the atmosphere. Such gas as this accelerates oxidizing effect.

By irradiating laser light or other light as strong as laser light to a silicon film having crystal character, a thin silicon oxide film can be formed on the surface of the silicon film. Especially in the case of irradiating ultraviolet light, chemical reaction is enhanced and a good silicon oxide film can be utilized.

After irradiating laser light or strong light, by forming an insulating film such as silicon oxide by a deposition method like plasma CVD method and the like, an insulating film can be formed with thickness demanded, on an oxide film or nitride film having good interface character formed on the semiconductor surface.

A nitride film or an oxide film with good interface state can be formed on semiconductor surface by irradiating laser light or other light as strong as laser light to semiconductor, especially to silicon semiconductor in nitrogenizing or oxidizing atmosphere.

Especially by utilizing silicon as semiconductor and by irradiating laser light or other light as strong as laser light to non-single crystal silicon film, a silicon nitride film, a silicon oxide film, or a silicon oxinitride film with good interface state is formed on the surface of a non-single crystal semiconductor film, and crystal character of the non-single crystal semiconductor film can be improved. Especially a silicon oxide film formed in this way has small static electricity and low interface state concentration (Qss), like the silicon oxide film obtained by heat oxidation at 1000 to 1200° C. in usual dry oxygen. Therefore this silicon oxide film is appropriate as a gate insulting film of an insulated gate type device like TFT.

By forming an insulating film like a silicon oxide film on the oxide film above mentioned, a gate insulating film with thickness enough and with good interface character as a gate insulating film of TFT can be formed on a semiconductor film. That is, in the present invention, a gate insulating film comprises at least two layers, and the thin oxide film touching the semiconductor has been formed of semiconductor oxidized by irradiation of laser and the like. Therefore interface character of the gate insulating film is good. However, solely this fact is not sufficient for being utilized as a gate insulating film, in consideration of dielectric strength and the like. A preferable gate insulating film can be obtained by forming on the thin oxide film an insulating film having necessary thickness and dielectric strength by vapor phase growth method.

It is preferable that all of the deposition process like this is performed in an environment actually separated from air. If once the semiconductor surface is exposed to air after irradiation process of laser and the like, the surface is polluted, and a good oxide film and the like obtained by irradiation of laser and the like is deteriorated. Therefore a process of exposing the semiconductor surface to air must not be performed during formation of an insulating film by irradiation of laser and the like and vapor phase deposition method. Therefore in the present invention, a special means for transporting substrates between these apparatuses is demanded.

Other objects and features of the invention will appear in the course of the description thereof, which follows.

BRIEF DESCRIPTION OF THE DRAWINGS

FIGS. 8(A) to 8(E) show manufacturing procedure of EXAMPLE 6;

DETAILED DESCRIPTION OF THE INVENTION

EXAMPLE 1

Figure 1:
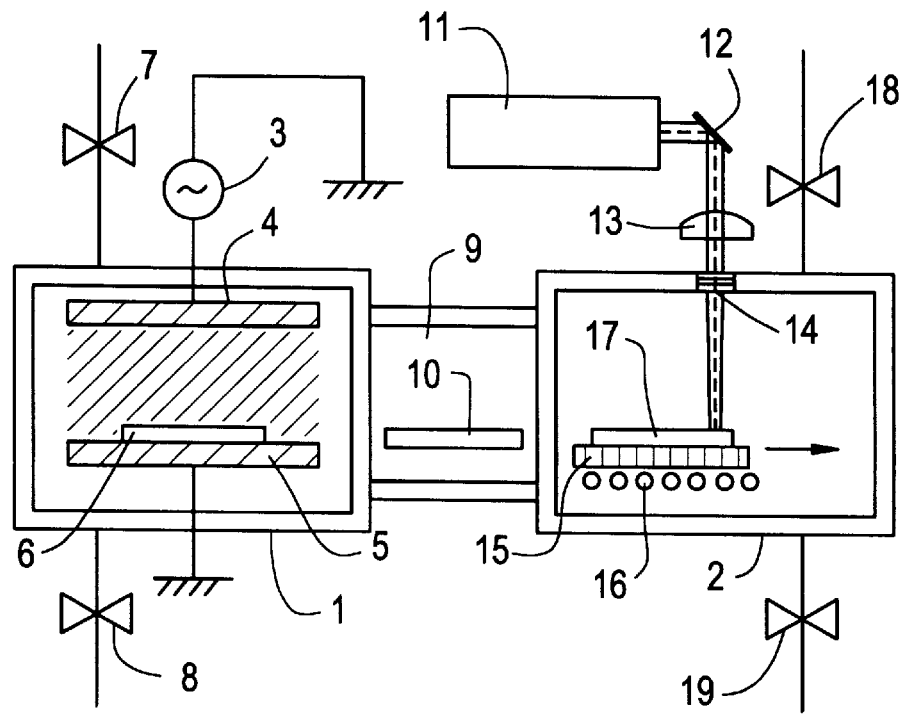
FIG. 1 is a conceptual diagram of a multi-chamber system according to the present invention.

Referring to FIG. 1, there is shown a multi-chamber system according to the invention. This multi-chamber system comprises a plasma CVD film formation apparatus and a laser processing apparatus (e.g., a laser annealing apparatus). A preliminary chamber is formed between these two apparatuses. The plasma CVD apparatus has a chamber 1 equipped with a gas intake valve 7 and an exhaust valve 8. The laser annealing apparatus has a chamber 2 equipped with a gas intake valve 18 and an exhaust valve 19. These valves permit requisite gases to go into and out of these chambers. Also, these valves make it possible to maintain the pressure inside each chamber at an appropriate value.

The chamber 1 is further equipped with electrodes 4 and 5. A substrate or sample 6 to be processed is placed on the electrode 5. An RF power supply 3 of frequency, for example, of 13.56 MHz is connected with the electrode 4. An adequate gas such as monosilane or disilane is admitted into the chamber to induce electric discharge between the electrodes. In this way, a film is formed on the substrate 6. If necessary, the substrate may be heated. Where monosilane is used as the above-described gas and the substrate is maintained below 300° C., an amorphous silicon film is formed on the substrate.

Since such amorphous silicon film does not have excellent electrical characteristics, the silicon is crystallized by laser annealing to improve the characteristics. The chamber 2 is provided with a window 14. Laser light emitted from a laser 11 passes through the window 14 via a mirror 12 and a lens 13 and impinges on a substrate 17 that is placed on a sample holder 15. The substrate 17 is heated to 300–500° C., preferably 300–400° C., by a heater 16. This heating operation is indispensable to the process where crystallization is effected with high reproducibility.

The simple holder 15 is capable of moving gradually to the right as viewed in the figure while carrying the substrate 17. As a result, the whole surface of the substrate can be processed by the laser light. Let us assume that the substrate measures 300 mm by 400 mm. The whole surface of the substrate can be treated with the laser light by shaping the cross section of the laser beam into a rectangular form measuring 2 mm×350 mm. If the holder moves at a speed of 20 mm/sec, the time taken to process o e substrate is 400/20=20 seconds.

A substrate on which an amorphous silicon film is formed by the plasma CVD apparatus 1 is transported into the laser processing apparatus 2 in the sequence described below. After the formation of the film, the inside of the film formation apparatus 1 is evacuated to a sufficiently high vacuum. Also, the preliminary chamber, indicated by 9, is evacuated to a sufficiently high vacuum. A gate mounted between the film formation chamber 1 and the preliminary chamber is opened, followed by shift of the substrate into the preliminary chamber. Thereafter, the gate is closed. A reactive gas is again introduce into the film formation apparatus to start growth of a film.

At this time, the inside of the laser processing apparatus 2 is evacuated to a sufficiently high vacuum. The inside of the preliminary chamber 9 has been already maintained as a sufficiently high vacuum. The gate between the preliminary chamber and the laser processing apparatus is opened, and then the substrate is transported from the preliminary chamber into the laser processing apparatus. Subsequently, the gate is closed. The sample holder 15 is heated to an appropriate temperature by the heater 16. After the temperature has stabilized and the substrate set in the laser processing apparatus has been accurately aligned, laser processing is carried out.

At this time, if the time required for the laser processing apparatus to process one substrate (including operations for placing the substrate in position, aligning, and taking out the substrate) is substantially equal to the time required for the plasma CVD apparatus to form a film (including operations for placing the substrate in position and evacuating the inside), then no waiting time is necessary between the processing performed by the plasma CVD apparatus and the processing conducted by the laser processing apparatus. If the time taken to process one substrate by laser light is half of the time taken to form a film by the plasma CVD apparatus, then the film may be formed on two substrates in one operation by the plasma CVD apparatus In this case, after completion of the film, the two substrates are moved into the preliminary chamber. One of them is transported into the laser processing apparatus where the substrate is processed. The other is preserved in the preliminary chamber. After the first one is processed, the one preserved in the preliminary chamber is processed.

EXAMPLE 2

Figure 2:
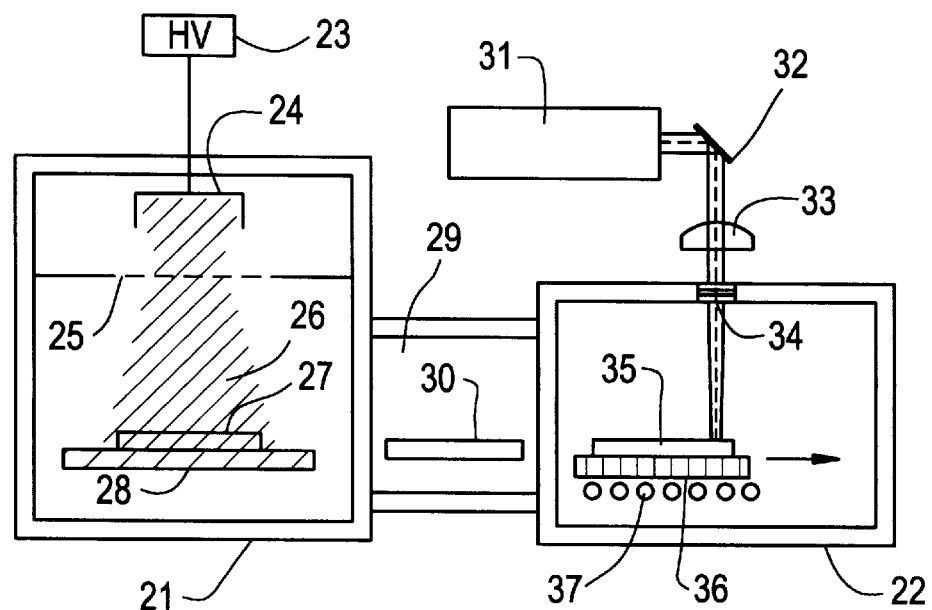
FIG. 2 is a conceptual diagram of another multi-chamber system according to the present invention.

Referring to FIG. 2, there is shown another multi-chamber system according to the invention. This system comprises a combination of a plasma doping apparatus and a laser processing apparatus (e.g., a laser annealing apparatus). A preliminary chamber formed between these two apparatuses.

The plasma doping apparatus and the laser annealing apparatus have chambers 21 and 22, respectively. These chambers are designed so that requisite gases can be introduced into them and that unwanted gases can be expelled from them. Also, the pressure inside each chamber can be maintained at an appropriate value.

The chamber 21 is further equipped with an anode electrode 24 and a grid electrode 25. A high voltage which can be increased up to 100 kV is applied to the anode from a high voltage source 23. A plasma is produced around the grid electrode by RF discharge and contains positive ions 26. These ions 26 are accelerated toward a sample holder 28 by the high voltage described above. As a result, accelerated positive ions are implanted into a substrate or sample 27 lying on the sample holder 28.

This ion implantation changes the state of the crystalline material such as a single crystal of silicon or crystalline silicon formed on the substrate into an amorphous or almost amorphous state. In consequence, the electrical characteristics are deteriorated. Therefore, the substrate is crystallized by laser annealing to improve the characteristics. The chamber 22 is provided with a window 34. Laser light emitted from a laser 31 passes through the window 34 via a mirror 32 and a lens 33 and impinges on a substrate 35 that is placed on a sample holder 36. The substrate may be heated by a heater 37. The sample holder is capable of moving gradually to the right as viewed in the figure while carrying the substrate. As a result, the whole surface of the substrate can be processed by the laser light. The substrate doped by the plasma doping apparatus 21 is moved into the laser processing apparatus 22 via the preliminary chamber 29, in the same way as in Example 1.

In the present example, the doping apparatus makes use of ion implantation which uses a plasma source. Obviously, the doping apparatus can be replaced by an ion implanter which separates ions according to their masses and implants them into the substrate.

EXAMPLE 3

Figure 3:
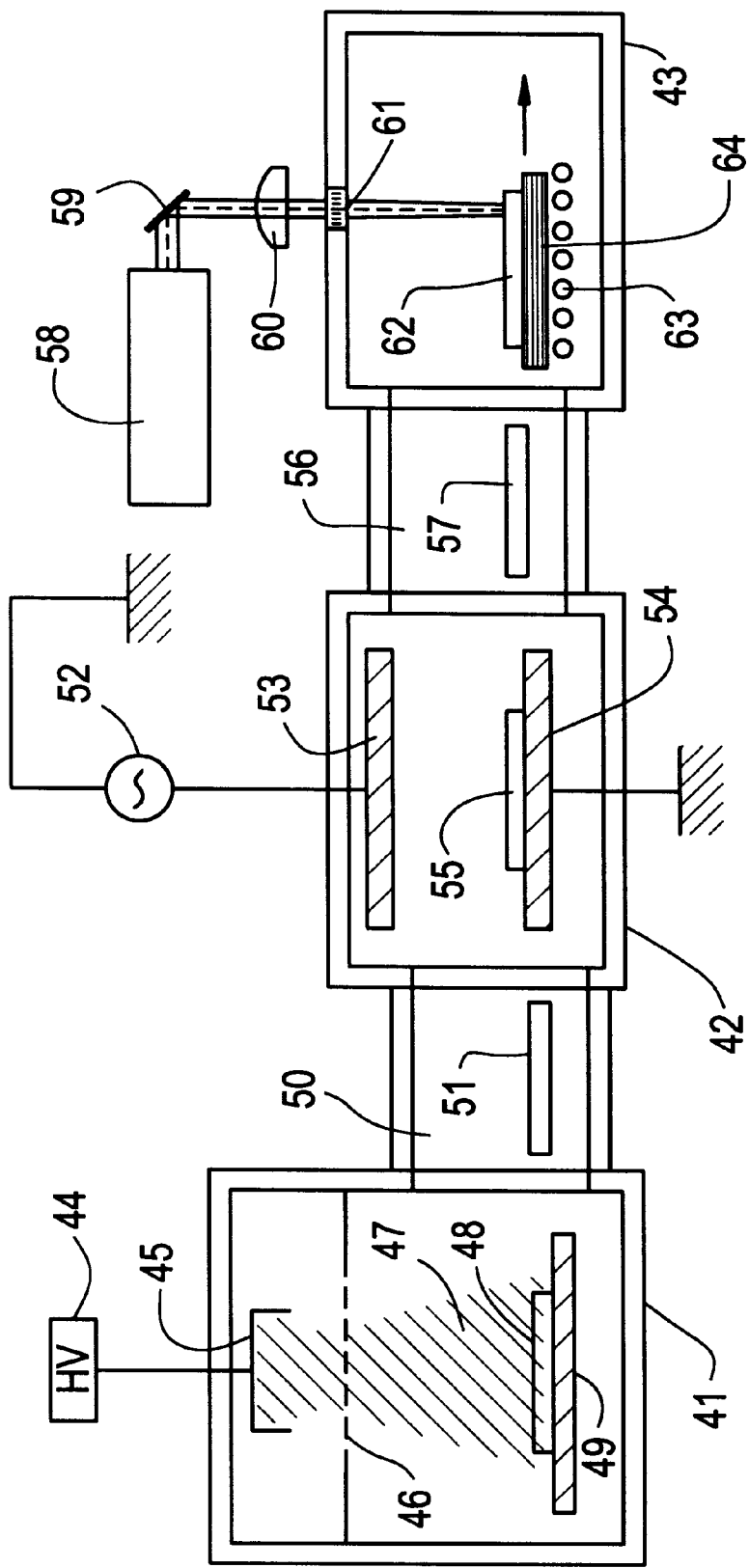
FIG. 3 is a conceptual diagram of a further multi-chamber system according to the present invention.

Referring next to FIG. 3, there is shown a further multi-chamber system according to the invention. This system comprises a combination of a plasma doping apparatus, a dry etching apparatus, and a laser processing apparatus (e.g., a laser annealing apparatus). A preliminary chamber is formed between any adjacent ones of these three apparatuses.

The plasma doping apparatus, the etching apparatus, and the laser annealing apparatus have chambers 41, 42, and 43, respectively. These chambers are designed so that requisite gases can be introduced into them and that unwanted gases can be discharged from them. Also, the pressure inside each chamber can be maintained at an appropriate value.

The chamber 41 is further equipped with an anode electrode 45 and a grid electrode 46. A high voltage which can be increased up to 100 kV is applied to the anode from a high voltage source 44. A plasma is produced around the grid electrode by RF discharge and contains positive ions 47. These ions 47 are accelerated toward a sample holder 49 by the high voltage described above. As a result, accelerated positive ions such as boron ions or phosphorus ions are implanted into the substrate or sample 48 lying on the sample holder 49.

For example, it is assumed that a layer of crystalline silicon is formed on the insulating substrate 48 and that a layer of silicon oxide is formed on the layer of crystalline silicon. Also, it is assumed that gate electrodes of thin-film transistors are formed. Desired impurities are implanted into the silicon oxide layer and the silicon layer by this doping method. This method inadequate to form semiconductor devices with high production yield because the doping is carried out through the material such as silicon oxide.

As already described in Example 2, this ion implantation deteriorates the crystallinity and hence the crystallinity is improved by laser annealing or other method. An impurity is also injected into the silicon oxide. Where a UV excimer laser adapted for mass production such as a KrF laser emitting a wavelength of 248 nm, an XeCl laser emitting a wavelength of 308 nm, or a XeF laser emitting a wavelength of 350 nm is used for the laser annealing, a problem takes place. In particular, pure silicon oxide is transparent to UV light of wavelengths exceeding 200 nm but silicon oxide containing impurities absorbs such UV light to a considerable extent. As a result, a major part of the laser energy is absorbed by the silicon oxide film. This makes it impossible to use the laser energy efficiently in improving the crystallinity. To solve this problem, the silicon oxide film is etched so that laser radiation may be efficiently absorbed by the film whose crystallinity should be improved. The etching apparatus 42 is provided for this purpose.

The etching apparatus 42 is equipped with electrodes 53 and 54. An RF power supply 52 is connected with the electrode 53. A substrate is placed on the electrode 54. As an example, if an electric discharge is produced between the electrodes by electric power from the RF power supply within an ambient of carbon tetrafluoride, then the silicon oxide film on the substrate can be etched.

The laser processing apparatus 43 is substantially the same as the laser processing apparatus described in Examples 1 and 2. The chamber 43 is provided with a window 61. Laser light emitted from a laser 58 passes through the window 61 via a mirror 59 and a lens 60 and impinges on a substrate 62 lying on a movable sample holder 64. The substrate may be heated by a heater 63.

The substrate doped by the plasma doping apparatus 41 is transported into the etching apparatus 42 via a preliminary chamber 50 in the same way as in Example 1. After end of etching processing, the substrate is moved into the laser processing apparatus 43 via the preliminary chamber 56.

An example of fabrication of thin-film transistors (TFTs), using such a multi-chamber system, is described by referring to FIG. 5, (A)–(F). A silicon oxide film 102 forming a base layer and having a thickness of 20 to 200 nm is formed on a glass substrate 101 made of Corning 7059 by sputtering or plasma CVD. Then, amorphous silicon is deposited as a 100–200 nm-thick-film by LPCVD, plasma CVD, sputtering, or other similar method. The laminate is heated to 550–650° C. for 4 to 48 hours within an ambient of nitrogen or in a vacuum to crystallize the amorphous silicon film.

The crystallized silicon film is patterned into N-type regions 103 and P-type regions 104. A silicon oxide film 105 having a thickness of 50 to 150 nm and acting as a gate oxide film is formed. Then, gate electrodes 106 and 107 are fabricated from aluminum, tantalum, chromium, tungsten, molybdenum, silicon, an alloy of some of them, or the material of multilayer conductive interconnects (FIG. 5(A)).

Then, masking material 108 such as a photoresist is formed only on the N-type regions 103. Boron ions are implanted by the plasma doping apparatus 41 shown in FIG. 3. The boron ions are accelerate at an accelerating voltage of 20 to 65 keV, typically 65 keV. Th dose is $6\times10^{15}$ atoms/cm$^2$. P-type regions 109 are formed by this doping process (FIG. 5(B)).

After the end of the doping process, the substrate is conveyed into the etching apparatus 42, where the masking material 108 is removed by electric discharge within an ambient of oxygen. Usually, a high efficiency would be obtained by peeling the masking material such as a photoresist with a peeling liquid. However, where moving the substrate into and out of a vacuum apparatus is taken into account, ashing by the etching apparatus will give a high efficiency to the multi-chamber system shown in FIG. 3. Also, a high throughput will be derived.

The substrate is returned to the doping apparatus 41, where phosphorus atoms are implanted. The phosphorus atoms are accelerated at an accelerating voltage of 20 to 85 keV, typically 80 keV. The dose is $4\times10^{15}$ atoms/cm$^2$. N-type regions 110 are formed by this doping process (FIG. 5(C)).

Then, the substrate is again transported into the etching apparatus 42, where the silicon oxide film 105 is etched. As described previously, large amounts of phosphorous and boron are contained in the silicon oxide film. Laser light is strongly absorbed by the silicon oxide film. This makes it impossible to conduct laser annealing efficiently (FIG. 5(D)).

After the silicon oxide film 105 is etched, the substrate is transported into the laser processing apparatus 43, where laser annealing is conducted. A KrF laser emitting laser radiation having a pulse width of 20 nsec and a repetition frequency of 200 Hz is used for the laser annealing. Obviously, other kind of laser can also be employed. The energy density per pulse of laser beam is 200 to 400 mJ/cm$^2$, preferably 250 to 300 mJ/cm$^2$. This energy density is modified according to other conditions such as the dose and the thickness of the silicon film (FIG. 5(E)).

After completion of the laser annealing, the substrate is taken out, and an interlayer insulating film 111 and metal interconnects-and-electrodes 112 are formed. Of course, a film formation chamber may be added to the multi-chamber system of FIG. 3 to form the interlayer insulating film continuously. By carrying out these steps, N-channel and P-channel TFTs are formed.

Figure 4:
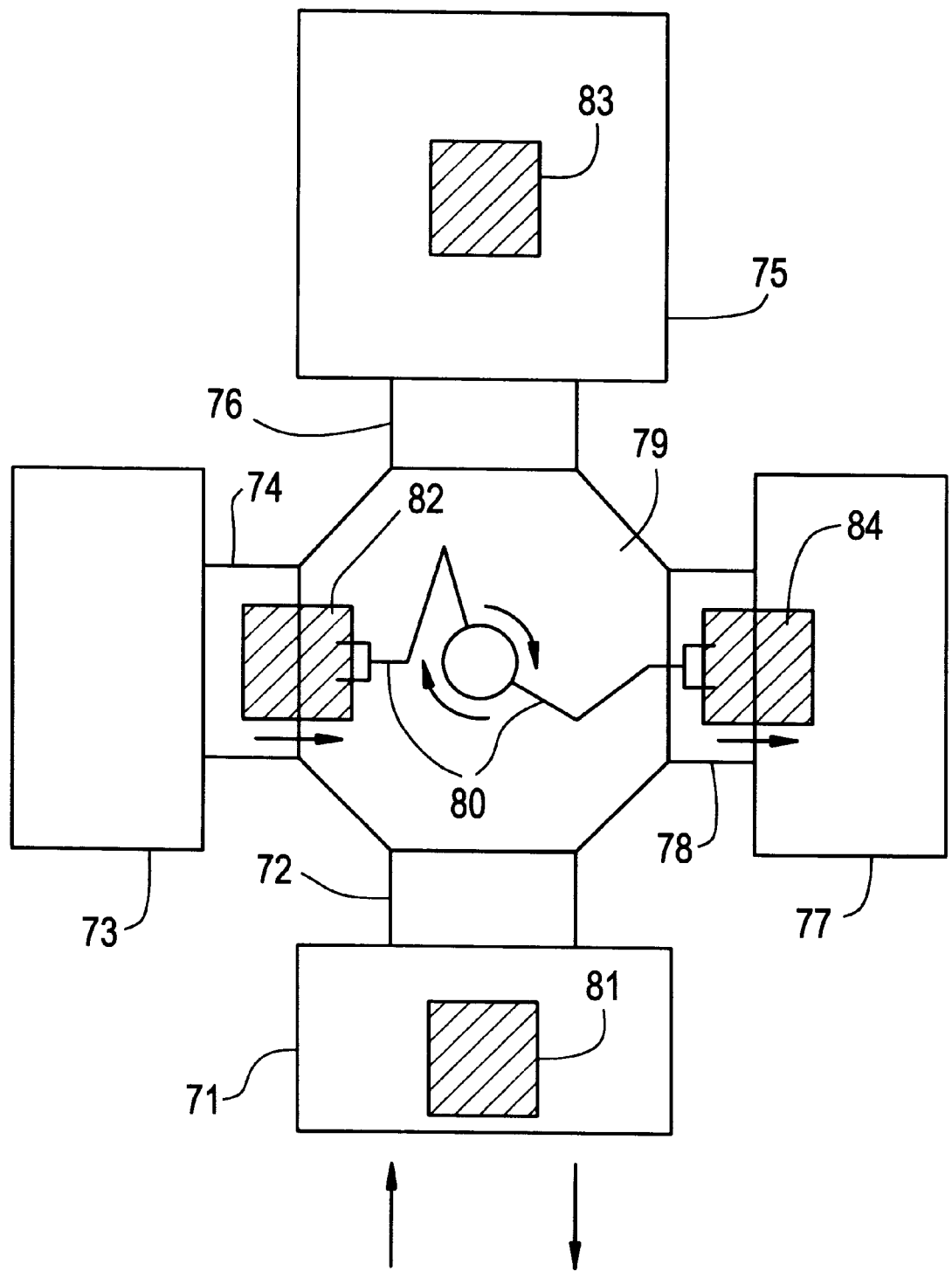
FIG. 4 is a conceptual diagram of a still other multi-chamber system according to the present invention.
Figure 5A:
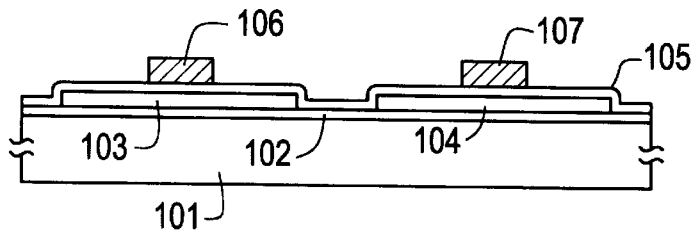
FIGS. 5(A) to 5(F) are cross-sectional views illustrating a series of operations successively performed to fabricate semiconductor devices according to the invention.
Figure 5B:
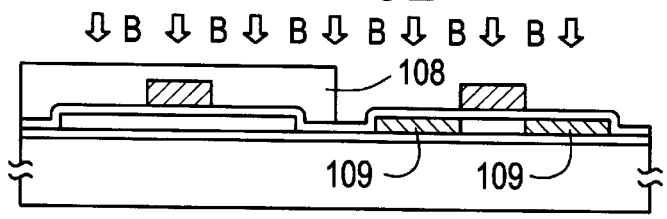
Figure 5C:
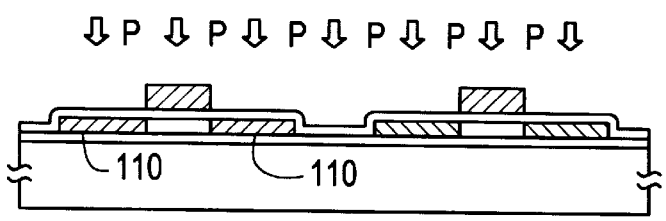
Figure 5D:
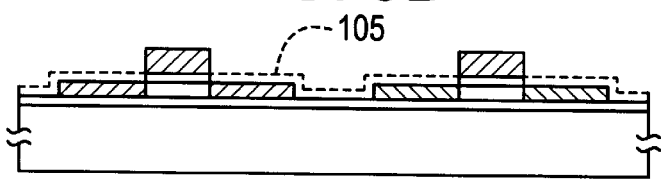
Figure 5E:
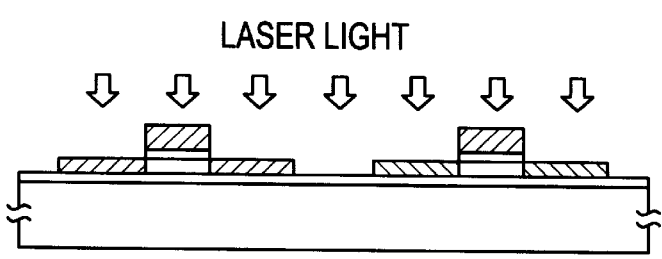
Figure 5F:
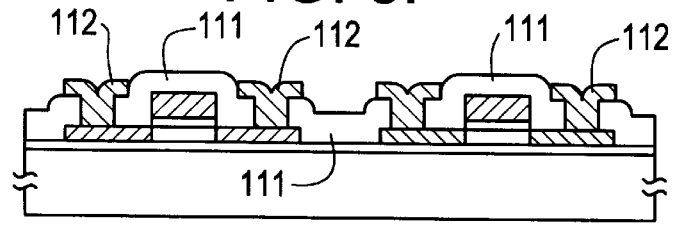

In FIG. 3, the various vacuum apparatuses are shown to be connected in series. For example, the vacuum apparatuses may be connected in parallel as shown in FIG. 4, where a chamber 71 for introduction and takeout of substrates, a laser processing apparatus 73, a plasma doping apparatus 75, and an etching apparatus 77 are connected with a common preliminary chamber 79 via gates 72, 74, 76, 78, respectively.

Substrates 81–84 are transported into the preliminary chamber and other chamber by a magic hand 80. This system can be expanded as the need arises. During mass production, flexibility (e.g., capability of adding a film formation step and an etching step and flexibility given to modification of tact arising from elongation if the film formation time) can be enhanced.

EXAMPLE 4

Figure 6:
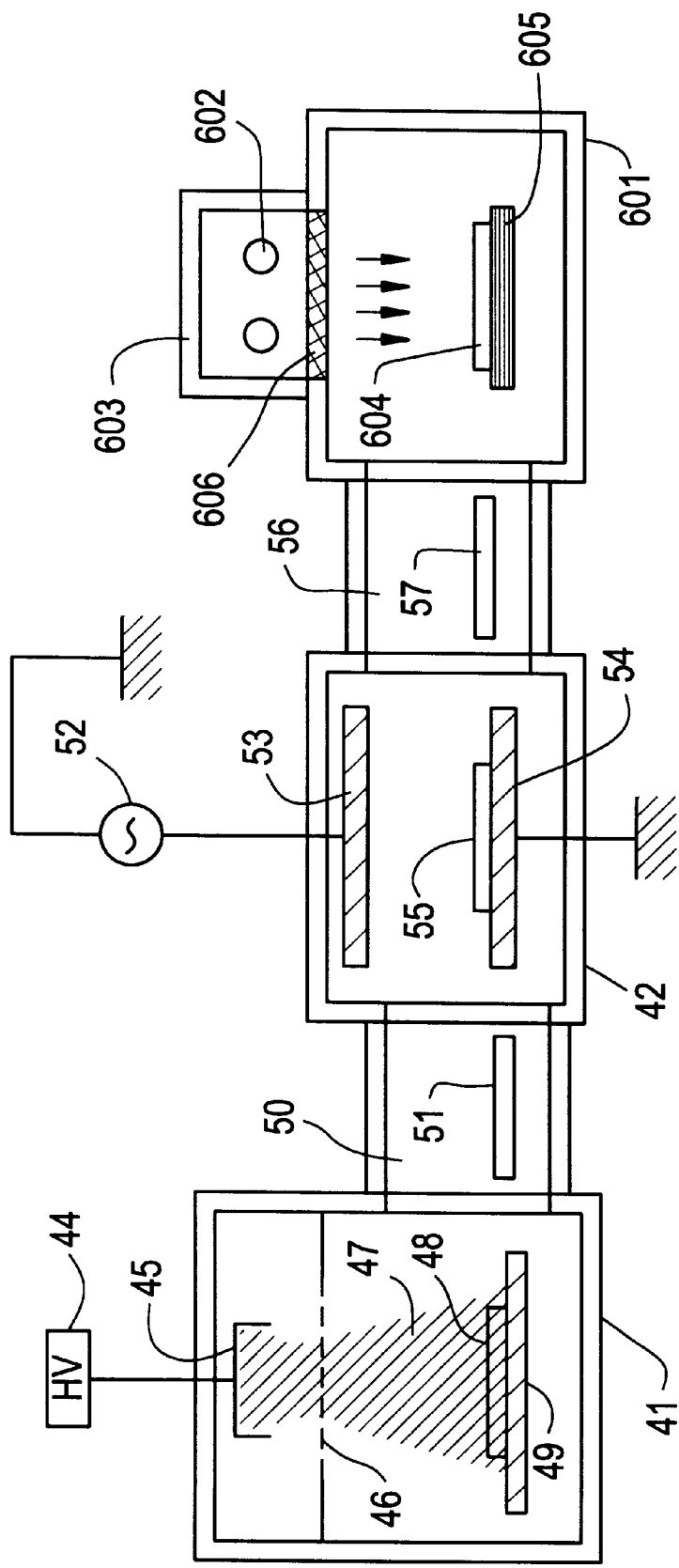
FIG. 6 is a conceptual diagram of a yet other multi-chamber system according to the invention.
Figure 7A:
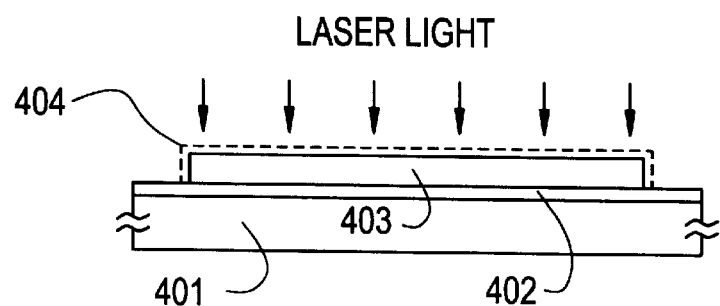
FIGS. 7(A) to 7(D) show manufacturing procedure of EXAMPLE 5.
Figure 7B:
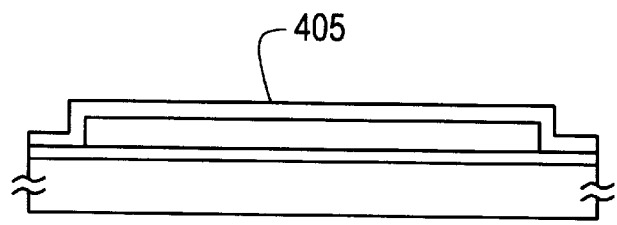
Figure 7C:
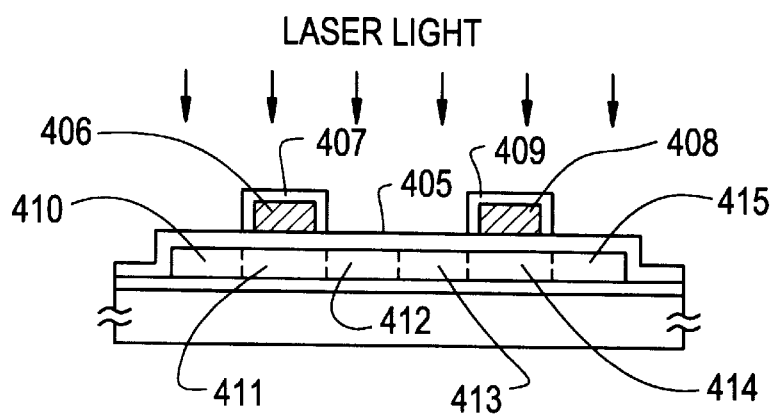
Figure 7D:
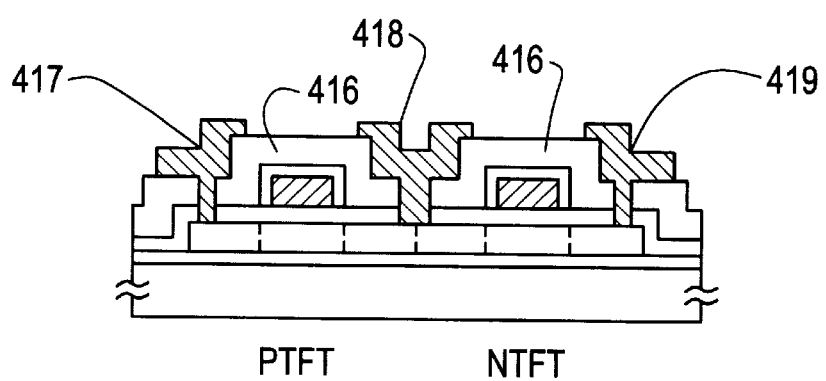
Figure 9A:
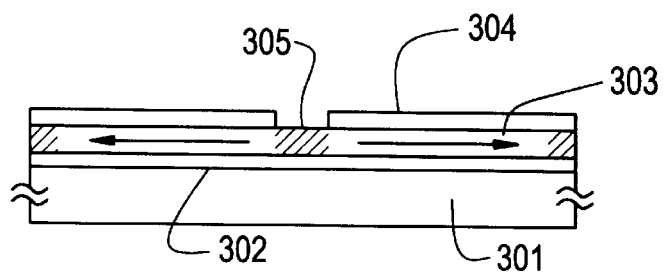
FIGS. 9(A) to 9(E) show manufacturing procedure of EXAMPLE 7.
Figure 9B:
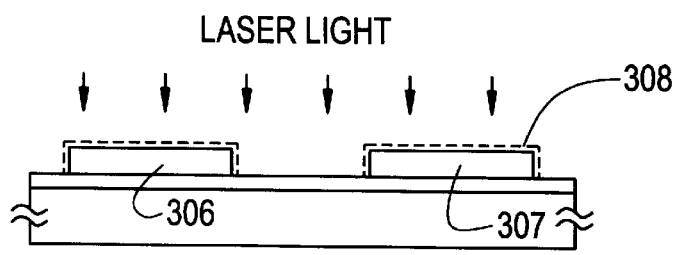
Figure 9C:
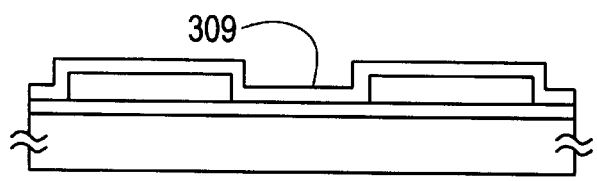
Figure 9D:
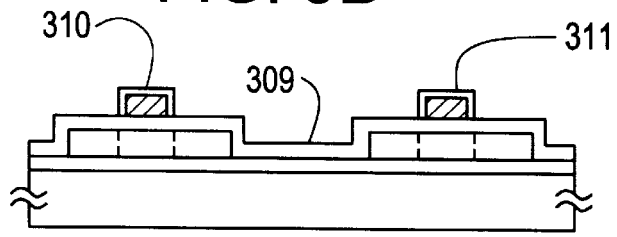
Figure 9E:
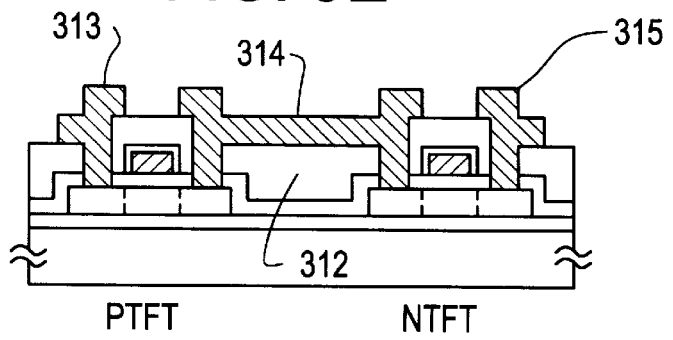

Referring to FIG. 6, a plasma doping apparatus has a chamber 41. An etching apparatus has a chamber 42. A rapid thermal anneal (RTA) using infrared radiation is conducted within a chamber 601. The chamber 41 is connected with the chamber 42 by a preliminary chamber 50. The chamber 42 is connected with the chamber 601 by a preliminary chamber 56. It is to be noted that like components are indicated by like reference numerals in both FIGS. 3 and 6.

The chamber 601 for conducting a rapid thermal anneal comprises a light source or lamp 602 emitting infrared light, the chamber 603 forming a light source chamber, and a quartz window 606 transmitting infrared light. The chamber 601 is further provided with a gas intake system (not shown) for introducing inert gas and requisite gases and also with a gas exhaust system (not shown).

A substrate 604 is placed on a substrate holder 605 and transported into the various chambers by a magic hand, or a robot hand for transporting substrates. The substrate may be transported alone or together with the substrate holder.

It is common practice to conduct a rapid thermal anneal within an ambient of an inert gas such as nitrogen. Alternatively, the anneal may be carried out within an ambient of ammonia (NH$_3$), nitrous oxide (N$_2$O), or oxygen.

An example using an apparatus shown in FIG. 6 is described now. FIG. 5 illustrates the sequence of steps for fabricating TFTs. We now consider a situation in which only the right TFT is manufactured. In this case, a silicon oxide film is formed on the active layer 104. Then, the substrate is conveyed into the chamber 601, where a rapid thermal anneal is to be carried out. The inside of the chamber 601 is filled with an inert gas and illuminated with infrared light emitted from the lamp 602. This step improves the characteristics of the interface between the active layer 103 and the silicon oxide film 105. Specifically, the interface level at the interface between the channel formation region and the gate-insulating film can be reduced.

The inside of the chamber 601 is evacuated. The substrate is transported into the preliminary chamber 56 the inside of which is maintained substantially at the same subatmospheric pressure as the pressure inside the chamber 601. The substrate is conveyed into the chamber 41, where a plasma doping process is effected, via the chamber 42 and the preliminary chamber 50 which are similarly maintained at subatmospheric pressure. It is important that these steps for conveying the substrate be carried out without exposing the substrate to outside air.

A required ion implantation step is performed inside the chamber of the doping apparatus. The substrate is then moved into the chamber 42 of the etching apparatus while maintaining the degree of vacuum. A dry etching process is carried out to remove the exposed oxide film 105. The substrate is transported into the chamber 601, where a rapid thermal anneal is effected to activate the implanted impurity. At this time, the absence of the oxide film 105 is important for efficient achievement of the rapid thermal anneal. In particular, the impurity lodged at the time of the ion implantation exists inside the silicon oxide film 105, and this impurity absorbs infrared light.

The structure of the apparatus described thus far may be replaced by a combination of a chamber for illuminating laser radiation and a chamber where a rapid thermal anneal is conducted. Furthermore, a plurality of chambers required may be combined.

EXAMPLE 5

Referring to FIG. 1, there is shown a multi-chamber system according to the invention. This multi-chamber system comprises a plasma CVD film formation apparatus and a laser processing apparatus (e.g., a laser annealing apparatus). A preliminary chamber is formed between these two apparatuses. The plasma CVD apparatus his a chamber 1 equipped with a gas intake valve 7 and an exhaust valve 8. The laser annealing apparatus has a chamber 2 equipped with a gas intake valve 18 and an exhaust valve 19. These valves permit requisite gases to go into and out of these chambers. Also, these valves make it possible to maintain the pressure inside each chamber at an appropriate value.

The chamber 1 is further equipped with electrodes 4 and 5. A substrate or sample 6 to be processed is placed on the electrode 5. An RF power supply 3 of frequency, for example, of 13.56 MHz is connected with the electrode 4. An adequate gas such as monosilane or disilane and oxygen, dinitrogen monoxide and the like is admitted into the chamber to induce electric discharge between the electrodes. In this way, a film is formed on the substrate 6. If necessary, the substrate may be heated.

A window 14 is provided to the chamber 2. Laser light from a laser apparatus 11 via a mirror 12 and a lens 13 is irradiated to a substrate 17 on a sample holder 15 through the window. The substrate is heated at 200 to 500° C., preferably at 300 to 400° C., by heater 16. This heating is indispensable in performing crystallization with good reproducibility.

In chamber 2, improvement of characteristic is attempted by improving crystal character by laser annealing. Here, by making oxygen atmosphere in the chamber of the laser annealing apparatus, improvement of crystal character of a non-single crystal silicon film of amorphous silicon film and the like and formation of the oxide film on the surface is simultaneously performed. In the same way, if laser annealing is performed in nitriding atmosphere like ammonia atmosphere, a nitride film is formed. In atmosphere of dinitrogen monoxide or atmosphere of mixture of oxygen and ammonia, an oxinitride film is formed.

The sample holder is capable of moving gradually to the right as viewed in the figure while carrying the substrate. As a result, the whole surface of the substrate can be processed by the laser light. Let us assume that the substrate measures 300 mm by 40 mm. The whole surface of the substrate can be treated with the laser light by shaping the cross section of the laser beam into a rectangular form measuring 2 mm×350 mm. If the holder moves at a speed of 20 mm/sec, the time taken to process one substrate is 400/20=20 seconds.

A substrate on which an amorphous silicon film or a polycrystal silicon film in the shape of an island is formed is processed in the order as the following. First of all, a preliminary chamber is exhausted to $10^{-5}$ to 1 torr. On the other hand, the chamber 2 of the laser processing apparatus is exhausted to a same level. By opening a gate between the preliminary chamber and the laser processing apparatus, substrate are transported from the preliminary chamber to the laser processing apparatus. After transportation, the gate is closed, and a gas of an appropriate pressure is introduced to the chamber 2. The sample holder 15 is heated to an appropriate temperature by heater 16. When temperature is stabilized and precise alignment of substrates set in the laser processing apparatus is finished, laser processing is performed. By this laser irradiation, crystal character of silicon is improved. Here, atmosphere is made as 1 to 1000 torr, and partial pressure of oxygen or nitrogen oxide (for example, dinitrogen monoxide ($N_2O$), nitrogen dioxide ($NO_2$) and the like) is made as 10% or more. As a result, a thin silicon oxide film is formed on the surface of a silicon film, simultaneously with laser irradiation.

After that, the chamber 2 is exhausted and its pressure is made as $10^{-5}$ to 1 torr. The substrates are put in the preliminary chamber 9 again, and are transported to the plasma CVD deposition chamber 1 evacuated to a same level as the preliminary chamber. During this deposition process, process of other substrates can be performed in the chamber 1. After deposition is finished, inner part of the deposition apparatus 1 is exhaust and made as $10^{-5}$ to 1 torr. By opening the gate between the deposition chamber 1 and the preliminary chamber, the substrates are transported to the preliminary chamber exhausted to the same level. The preliminary chamber is then made to the same pressure as atmospheric pressure, and the substrates are taken to the air.

If time spent for the above-mentioned process of a substrate in the laser apparatus, for example, time spent for setting, alignment, and putting-out of a substrate is approximately the same as that spent for the above-mentioned deposition in the plasma CVD apparatus including setting of a substrate and exhaustion, it is possible to process a substrate through the laser processing apparatus to the plasma CVD apparatus, without waiting time. If time for laser process of a substrate is a half of deposition time in the plasma CVD, two substrates are to be simultaneously deposited in the plasma CVD. In this case, two substrates are stocked in the preliminary chamber at first. One of these substrate is transported to the laser process apparatus, and is processed. The other is kept in the preliminary chamber. After the first substrate is processed, the other one having been kept in the preliminary chamber is processed. After both of the two substrates processed, they are transported to the plasma CVD apparatus and are simultaneously deposited.

Process of forming TFT by utilizing this apparatus is to be briefly explained. Figure of the process is shown in FIG. 7.

First of all, a base film 402 of silicon oxide is formed on a glass substrate 401 of Corning 7059 and the like. Preferable thickness of the silicon oxide film 402 is 1000 to 5000Å, so as to prevent contamination of ion from the glass substrate 401. Here, it is situated as 2000Å.

After that, an amorphous silicon film is deposited. It is preferable its thickness is 300 to 1000Å. Here, it is made as 500Å. By annealing at 400 to 500° C., for example, at 450° C., hydrogen is removed from the film. By processing this amorphous silicon film in the shape of an island, it is made as an island region 403. By irradiating laser to the substrate processed like this by a laser processing apparatus 2 of the apparatus in FIG. 1, an amorphous silicon film 403 in the shape of an island is transformed to a crystal silicon film.

KrF excimer laser is utilized as laser. Condition of laser irradiation is situated as energy concentration of 350 to 450 mJ/cm², 2 to 20 shots for one position, and substrate temperature of 200 to 400° C. Atmosphere of laser irradiation is oxygen/argon atmosphere of 1 atmospheric pressure. Partial pressure of oxygen is 20%.

As a result of this laser irradiation, a thin silicon oxide film 404 of thickness of several ten Å is formed on the surface of the island region 403. (FIG. 7(A))

After that, the substrate is transported to the plasma CVD apparatus in FIG. 1. Here, a silicon oxide film is formed. During a period that a substrate is transported from the laser process apparatus to the plasma CVD deposition apparatus, the substrate is never touched to atmospheric component like water.

A silicon oxide film 405 is formed by 1000 to 1500Å, for example, 1200Å from silane and dinitrogen monoxide in the plasma CVD apparatus 1. It is preferable to mix a little amount of trichloroethylene or hydrogen chloride in the material gas, because movable ion in the silicon film is also removed. This silicon oxide film 405 also functions as a gate insulating film of TFT. (FIG. 7(B))

After that, gate electrodes 406 and 408 are formed of aluminum tantalum, chrome, tungsten, molybdenum, silicon, or alloy of these kinds of metal, or material of multilayer connection and the like. By passing an electric current through the gate electrode in an electrolytic solution, anodic oxide films 407 and 409 are formed on the surface and around of the gate electrode. Thickness of the anodic oxide film is made as 1000 to 2500Å. This anodic oxide film has function of decreasing damages of the gate electrode caused later by ion doping, laser annealing, or process of depositing interlayer insulator.

By publicly known ion doping method and complemental MOS (CMOS) technology, P type regions 410, 412, and N type regions 413, 415 are formed. As a result, a channel region 411 of P channel TFT (PTFT) and a channel region 414 of N channel TFT (NTFT) are formed. By irradiating laser light to this, crystal character of the region damaged by ion doping is made better. This laser irradiation is to be also performed by the laser processing apparatus in FIG. 1. In this case, energy of laser does not have to be as strong as that utilized in the process in FIG. 7(A). As condition of laser irradiation, substrate temperature is situated as room temperature, and laser energy concentration is situated as 250 to 350 mJ/cm². Other conditions are the same as those in the process of FIG. 7(A). (FIG. 7(C))

After that, the substrate is transported to the plasma CVD apparatus in FIG. 1. A silicon oxide film 416 is formed as an interlayer insulator. Thickness of the silicon oxide film is 3000 to 8000Å, for example, 5000Å.

After that, a contact hole is opened in the island region, and aluminum film is deposited by 3000 to 8000Å thickness, for example, 5000Å. By etching this, wiring-electrodes 417, 418, and 419 are formed. By putting a titanium nitride film of 500 to 1500Å, for example, 1000Å thickness between aluminum and the island region, good contact characteristic is obtained. (FIG. 7(D))

The TFT formed by this example has good characteristic. For example field effect mobility of 200 to 300 cm$^2$/Vs for NTFT, and 100 to 250 cm$^2$/Vs for PTFT is obtained stably.

EXAMPLE 6

Referring next to FIG. 3, there is shown a further multichamber system according to the invention. This system comprises a combination of a plasma doping apparatus (also called as an ion doping apparatus), a plasma CVD apparatus (being also a dry etching apparatus), and a laser processing apparatus (e.g., a laser annealing apparatus). A preliminary chamber is formed between any adjacent ones of these three apparatuses.

The plasma doping apparatus, the etching apparatus, and the laser annealing apparatus have chambers 41, 42, and 43, respectively. These chambers are designed so that requisite gases can be introduced into them and that unwanted gases can be discharge from them. Also, the pressure inside each chamber can be maintained at an appropriate value.

The chamber 41 is further equipped with an anode electrode 45 and a grid electrode 46. A high voltage which can be increased up to 100 kV is applied to the anode from a high voltage source 44. A plasma is produced around the grid electrode by RF discharge and contains positive ions 47. These ions 47 are accelerated toward a sample holder 49 by the high voltage described above. As a result, accelerated positive ions such as boron ions, phosphorus ions, hydrogen ions or the like are implanted into the substrate or sample 48 lying on the sample holder 49.

For example, it is assumed that a layer of crystalline silicon informed on the insulating substrate 48 and that a layer of silicon oxide is formed on the layer of crystalline silicon. Also, it is assumed that gate electrodes of thin-film transistors are formed. Desired impurities are implanted into the silicon oxide layer and the silicon layer by this doping method. This method is called as through dope, and is adequate to form semiconductor devices with high production yield because the doping is carried out through the material such as silicon oxide.

The plasma CVD apparatus being also the etching apparatus 42 is equipped with electrodes 53 and 54. An RF power supply 52 is connected with the electrode 53. A substrate 55 is placed on the electrode 54. As an example, if an electric discharge is produce between the electrodes by electric power from the RF power supply within an ambient of carbon tetrafluoride, then the silicon oxide film on the substrate can be etched. If RF discharge produced in an ambient of oxygen, then organic matter such as photo resist is oxidized-removed, and what is called ashing is performed. If RF discharge is produced in an ambient of monosilane and oxygen, a silicon oxide film can be deposited.

The laser processing apparatus 43 is substantially the same as the laser processing apparatus described in EXAMPLE 5. The chamber 43 is provided with a window 61. Laser light emitted from a laser 58 passes through the window 61 via a mirror 59 and a lens 60 and impinges on a substrate 62 lying on a movable sample holder 64. The substrate may be heated by a heater 63. As laser to utilize, an excimer laser of ultraviolet light, which is suitable for mass production, for example, KrF laser (wavelength 248 nm), XeCl laser (308 nm) or XeF laser (350 nm) is desirable. Spare chambers 50 and 56 are provided between a plasma doping apparatus 41 and a plasma CVD apparatus 42, and a laser processing chamber 43.

Because this system has a lot of chambers, various kinds of processes can be performed. For example, first of all, proper amount of hydrogen ion is injected to an amorphous or polycrystal silicon island film formed on a substrate, in a plasma doping process apparatus 41. Nextly, laser is irradiated in a laser processing apparatus 43 in the atmosphere of oxygen or dinitrogen monoxide. Crystal character of the silicon region in the shape of an island is improved, and a thin silicon oxide film is formed on the surface of it. After that, the substrate is transported to a plasma CVD apparatus 42, and an insulating film like silicon oxide to be a gate insulating film is deposited. Process of injecting hydrogen ion is omissible.

This apparatus is also usable for process including doping process of source/drain. First of all, the substrate is coated with photo resist. In a plasma doping apparatus 41, a P type (or N type) impurity is doped only to a region to which P type (or N type) TFT is formed. After that, the substrate is transported to the plasma CVD apparatus 42. Photo resist is removed by performing RF discharge in oxygen atmosphere, that is, by performing ashing. As a result, the entire surface of the substrate is exposed.

The substrate is returned to the plasma doping apparatus 41 again, and then N type (or P type) impurity is doped. In this doping, N type (or P type) impurity is doped to a region which has been covered with photo resist in the doping process before. This region becomes N type (or P type). On the other hand, N type (or P type) impurity is also doped to a region which has been doped with P type impurity in the process before. This region can keep P type (or N type) by decreasing the dose amount of the first doping than that of the doping later.

After that, the substrate is transported to the laser process apparatus 43, and is annealed with laser to activate the impurity which has been doped, like EXAMPLE 5.

An example of fabrication of thin-film transistor (TFT), using such multi-chamber system, is described by referring to FIG. 8. A silicon oxide film 202 forming a base layer and having a thickness of 200 to 2000 Å is formed on a glass substrate 201 made of Corning 7059 by sputtering or plasma CVD. Then, amorphous silicon is deposited as a 300 to 1000Å-thick-film by LPCVD, plasma CVD, sputtering, or other similar method. The laminate is heated to 550–650° C. for 4 to 48 hours within an ambient of nitrogen or in a vacuum to crystallize the amorphous silicon film. Here, if a little amount of nickel is mixed to the film, temperature of crystallization can be decreased, and time of crystallization can be made short.

By patterning this crystallized silicon film, a region 203 in the shape of an island is formed. After that, the substrate is set in the apparatus shown in FIG. 3. By irradiating laser by a laser processing apparatus, crystal character of a silicon film 203 in the shape of an island is improved. Not like EXAMPLE 5, crystallization has been progressed to some degree in the silicon region in the shape of an island. However, the grain boundary still has a lot of minute amorphous elements. By crystallizing this amorphous element completely, characteristic of TFT can be improved drastically.

KrF excimer laser is utilized as laser. As condition of laser irradiation, energy concentration is 350 to 450 mJ/cm$^2$, the number of shots is 2 to 20 shots for a place, and substrate temperature is 200 to 400° C. The laser irradiation is performed in atmosphere of dinitrogen monoxide of 1 atmospheric pressure.

As a result of this laser irradiation, a thin silicon oxide film 204 of several 10Å thickness is formed on the surface of an island region 203. (FIG. 8(A)) After that, the substrate is transported to the plasma CVD apparatus 42 in the system in FIG. 3. A silicon oxide film 205 of 1000 to 1500Å thickness, for example, 1200Å thickness is deposited there. (FIG. 8(B))

After that, gate electrodes 206 and 208 are formed of aluminum in which scandium is contained by 0.1 to 0.3 percentage by weight. By passing an electric current through the gate electrode in electrolyte solution, anodic oxide films 207 and 209 are formed on the surface and around the gate electrode. Thickness of the anodic oxide film is made as 1000 to 2500Å.

The right part of the island region 203 in FIG. 8 is masked with photo resist, and is set in the apparatus in FIG. 3. Boron is doped by 0.5 to $5 \times 10^{15}/cm^2$ by plasma doping apparatus 41. As a result, P type regions 210 and 212 are formed in the left part of the island region 203, and a channel region 211 of PTFT is also formed. After that, the substrate is transported to the plasma CVD apparatus 42. Photo resist is removed by ashing with oxygen plasma. The substrate is transported to the plasma doping apparatus 41 again, and phosphorus is doped. It is desirable dose amount is situated as 0.1 to $2 \times 10^{15}/cm^2$, and is less than the dose amount of boron before. In this way, N type regions 213, 215 and a channel region 214 of NTFT are made. (FIG. 8(C))

The substrate is transported to the laser processing apparatus 43, and doped impurity is activated. As condition of laser annealing, substrate temperature is made as room temperature, and laser energy concentration is made as 250 to 350 mJ/$cm^2$. FIG. 8(D))

The substrate is transported to the plasma CVD apparatus 42 in FIG. 3, and a silicon oxide film 216 is formed as interlayer insulator. Thickness of the silicon oxide film is made as 3000 to 8000Å, for example, 5000Å. After that, the substrate is put out of the apparatus in FIG. 3. After opening a contact hole in the island region, a titanium nitride film is deposited by thickness of 1000Å, an aluminum film is deposited by thickness of 3000 to 8000Å, for example, 5000Å. By etching this, wiring-electrodes 217, 218, and 219 are formed. In this way, TFT circuit of CMOS type is formed. (FIG. 8(E))

EXAMPLE 7

Figure 11:
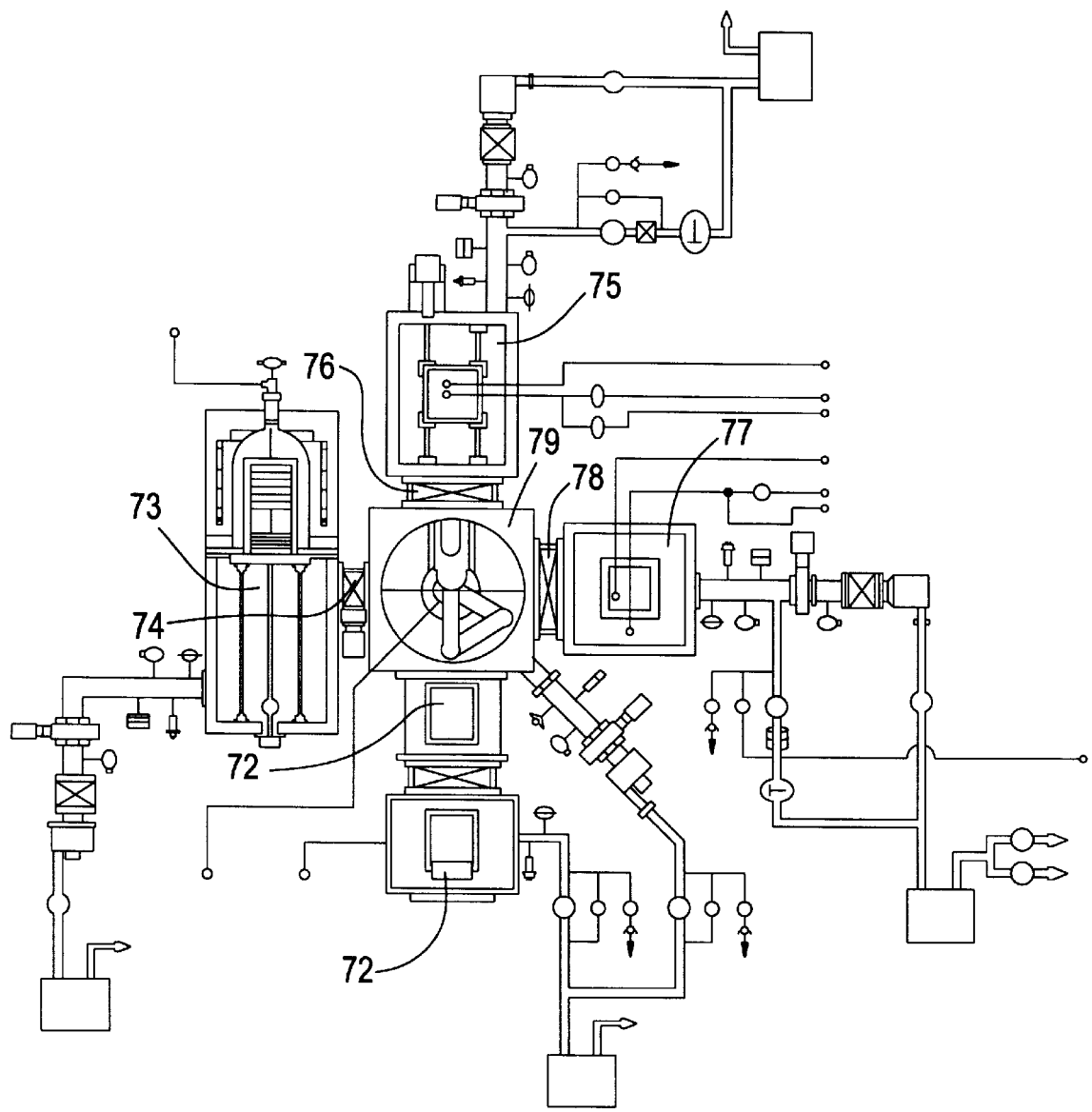
FIG. 11 shows a multi-chamber system of the present invention.

FIG. 4 shows a schematic figure of the system of the present invention with a structure of a multichamber. Detailed figure of the system of FIG. 4 is shown in FIG. 11.

Though the system of FIG. 3 comprises a multichamber in which three apparatuses are connected in a line, the apparatus of this example is a multichamber in the shape of a star. That is, this example as a chamber 71 comprising a loader-unloader 71, a chamber 73 comprising a heating chamber for performing various types of heating processes to a substrate (such as annealing in hydrogen atmosphere), a chamber 75 comprising a laser processing chamber for irradiating laser light, a chamber 77 comprising a deposition chamber for depositing a silicon oxide film by a sputtering method, and a common preliminary chamber (transporting chamber) 79. The preliminary chamber and each chamber are connected with one another by gates 72, 74, 76, and 78. A substrate is moved between each chamber as shown by 81 to 84 in FIG. 4, by robot hand 80 disposed in a common preliminary chamber 79.

Cassette to cassette (C-to-C) method can be utilized for a loader-unloader. In C-to-C method, when a plurality of substrates are set in a cassette in a loader-unloader, substrates are automatically transported one by one by robot, and those substrate of which process is finished are automatically returned to the cassette.

An example of forming TFT (thin film transistor) utilizing the system in FIG. 4 is explained as follows. This example is explained by utilizing FIG. 9. First of all, a Corning 7059 substrate is utilized as a glass substrate 301. After this substrate is annealed for 1 to 4 hours at 620 to 660° C., it is gradually cooled at 0.1 to 1.0° C./minute, preferably, 0.1 to 0.3° C./minute. This substrate is taken out when temperature is cooled down to 450 to 590° C.

A base film 302 is formed on a substrate, and an amorphous silicon film 303 is formed by 300 to 800Å thickness by plasma CVD method. A nickel film of 20 to 50Å thickness is formed by sputter method on a region indicated as 305, by the use of a silicon oxide mask 304 of 1000Å thickness. The nickel film may not be a continuous film. Not only sputter method but spin coating method can be utilized. Here, nickel added has effect of helping crystallization.

After that, heat annealing is performed in nitrogen atmosphere at 500 to 620° C., for example, 550° C., for 8 hours. Thus a silicon film 303 is crystallized. Crystallization starts at a region 305 in which a nickel film and a silicon film are touched. Growth of crystallization has proceeded in parallel to the substrate, as is shown by arrows (FIG. 9(A)).

By etching the silicon film 303, activated layer regions 306 and 307 in the shape of islands are formed. Here, nickel exists in a high concentration in a region to which nickel has been directly introduced and in a region of ends of crystal growth. It has been noticed these regions have nickel of which concentration is nearly 1 digit higher than that of other crystallize regions. Therefore, in this example, activated layer regions 306 and 307 have been formed avoiding those regions with high concentration of nickel, and the regions with high concentration of nickel are removed. An activated layer of TFT is formed in a region which has little nickel. The concentration of nickel in the activated region of this example is approximately $10^{17}$ to $10^{19}$ $cm^{-3}$.

The substrate processed in this way is put in the system shown in FIG. 4 from loader-unloader 71. After the substrate is set in the loader-unloader 71, all chambers are made in high vacuum. The gate 72 is opened, and the substrate is transported to a common preliminary chamber (transporting chamber) 79 by robot arm 80. Nextly, the gate 72 is closed, the gate 74 is opened, and the substrate is transported to a heat processing chamber 3. The atmosphere is made as hydrogen or nitrogen, and the substrate is heated as 200 to 400° C.

After that, the gate 74 and the gate 76 are opened, and the substrate is transported to the laser processing chamber 75. The gate 76 is closed, and the laser processing chamber 75 is made as oxygen atmosphere of normal pressure. Though it is oxygen atmosphere here, it can also be oxidizing atmosphere.

Laser light is irradiated in the same condition as EXAMPLE 6. A silicon oxide film 308 is obtained by 50 to 150Å thickness on the surface of the activated layers 306 and 307. Crystal character of the silicon film in the region crystallized by heat annealing before is further improved. (FIG. 9(B))

In this way, by pre-heating the substrate in the heat processing chamber before irradiation of laser, time from the moment the substrate is set in a laser processing chamber to the moment temperature of the substrate increases can be saved.

After irradiation of laser is completed, gas in the laser processing chamber 75 is exhausted, and is made as high vacuum state. The gate 76 is opened, and the substrate is transported to the common preliminary chamber 79 by robot hand. The gate 76 is closed. The gate 74 is opened, and the substrate is transported to the heat processing chamber 73.

After is transportation is finished, the gate 74 is closed. The heat processing chamber 73 is made as hydrogen atmosphere of normal pressure. Hydrogen heating process is performed at 350° C. for 30 minutes in a heat processing chamber 73.

In this hydrogen heating process, dangling bonds existing in the interface between an oxide film 308 and activated layers 306, 307 and ear the interface are neutralized. Thus state can be decrease and very desirable interface character can be achieved.

After the heating process is finished, the heat processing chamber 73 is made as high vacuum state. The gate 74 is opened, and the substrate is transported to the common preliminary chamber 79 by robot arm 80. The gate 74 is closed after this transportation is finished, then the gate 78 is opened, and the substrate is transported to the deposition chamber 77. After transportation is finished, the gate 78 is closed. A silicon oxide film 309 is deposited by a sputtering method in a deposition chamber 77. The sputtering target is made as high purity synthetic quartz. The silicon oxide film 309 is deposited by 1000Å thickness. This silicon oxide film has been assimilated with the oxide film 308 under itself, and can control film thickness freely, and is also prominent in interface character with the base. Thus the silicon oxide film 309 comprising a gate insulating film of TFT can be deposited. A silicon nitride film may be formed in place of the silicon oxide film 309.

The gate insulating film formed in this way will not be exposed to air during deposition process. Therefore surface of the interface will not be polluted, and appropriate interface character can be obtained. Especially the oxide film 308 formed by laser irradiation in oxygen atmosphere or oxide atmosphere is prominent in interface character with the silicon film constituting activated layers 306, 307 and having crystal character. A very preferable gate insulating film of TFT with low concentration of interface state can be obtained.

After the silicon oxide film 309 is deposited in the deposition chamber 77, hydrogen heat annealing can be further performed in a heat processing chamber 73.

After the silicon oxide film 309 is deposited in the deposition chamber 77, the deposition chamber 77 is made in high vacuum state. The gate 78 is opened, and then a substrate is transported to the common preliminary chamber 79. The gate 78 is closed. Nextly, the gate 72 is opened and the substrate is transported to the loader-unloader 71. The gate 72 is closed, and the substrate is taken out of the system from the loader-unloader 71.

A film mainly comprising aluminum is deposited by sputter method by 5000Å thickness. By etching and anodic oxidation like EXAMPLE 6 gate electrode portions 310 and 311 are formed.

Phosphorus and boron are injected like EXAMPLES 5 and 6, and source and drain regions of TFT are formed in self-align way.

After phosphorus and boron are doped, the source and drain regions are activated by irradiation of laser light or other light as strong as laser light. A silicon oxide film 312 is formed by approximately 5000Å thickness as interlayer insulator by plasma CVD method. After perforating holes in the silicon oxide film 312, source and drain electrode-wirings 313, 314, and 315 are formed. By performing hydrogen heating process in hydrogen atmosphere at 350° C., CMOS type TFT is completed.

When a laser light is supplied in a nitriding atmosphere instead of the oxidizing atmosphere, a silicon nitride film 308 is obtained.

In the present invention, a laser processing apparatus is combined with associated vacuum apparatus such as a film formation apparatus and an etching apparatus and a doping apparatus to form a system. This system is efficiently utilized to provide improved productivity. Especially by irradiating laser light to an amorphous or polycrystal film in oxygen atmosphere or oxidizing atmosphere, crystal character of the film can be improved, and simultaneously, an oxide film can be formed on the surface of it. After that, by depositing an insulating film like silicon oxide without being exposed to outside air, a gate insulating film excellent in interface state can be formed on a silicon film with crystal character.

Figure 10A:
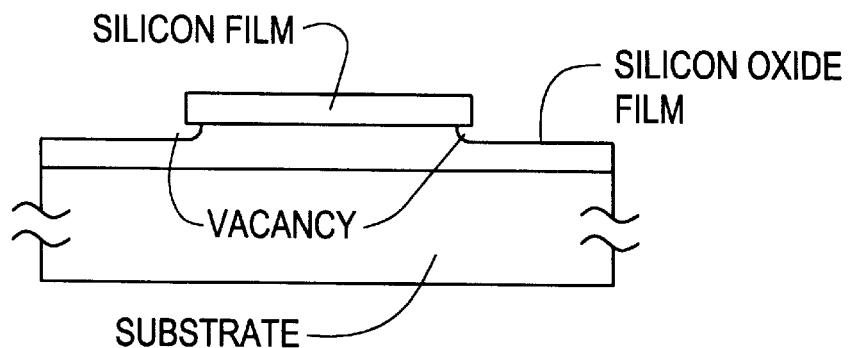
FIGS. 10(A) to 10(C) show difference between the conventional gate insulating film and the gate insulating film of the present invention.
Figure 10B:
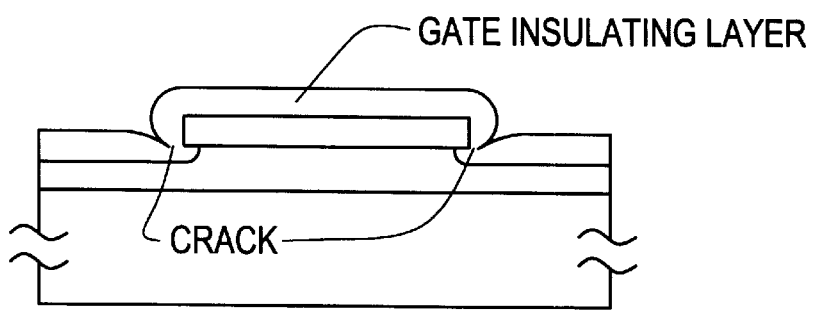
Figure 10C:
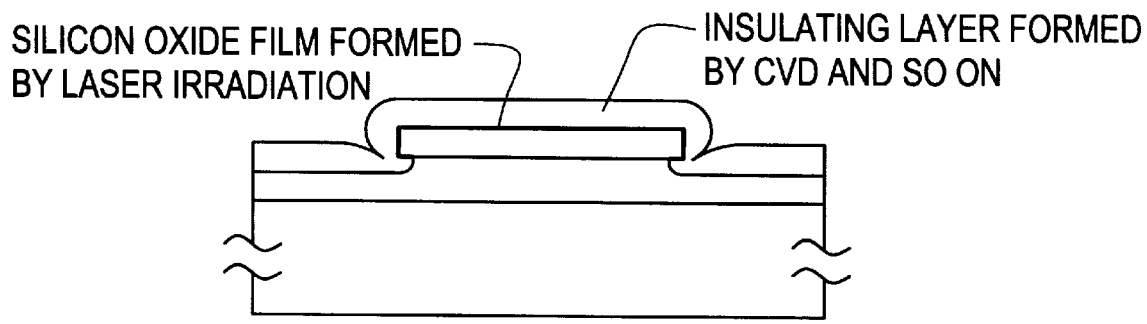

On the other hand, electrical short circuit at a step portion of the gate electrode with an island region can be prevented. That is, as is shown in FIG. 10(A), in the general TFT process, hen an island region is formed, vacancies are made on the edge of the silicon film by over-etch. Especially in the case that a silicon oxide film of the base is soft (etching rate is big), it is prominent. In the case of forming a gate insulating film in the prior PVD method or CVD method, because these vacancies cannot be buried well, short circuit is happened by crack and the like, and leak current is generated. (FIG. 10(B))

In the present invention, however, a minute oxide film or nitride film which has uniform thickness and which is free from pinhole and the like is formed around the silicon film, as a result of irradiating laser light or other light as strong as laser light. Even if crack as above mentioned is generated, there is little problem in practical use; short circuit will not happen between the gate electrode and the island region.

What is claimed is:

1. A method of manufacturing a semiconductor device comprising the steps of:

forming a non-single crystal semiconductor film comprising silicon;

irradiating a light to said non-single crystal semiconductor film comprising silicon under an oxidizing atmosphere;

forming an insulating film on said semiconductor film; and subjecting said semiconductor film to heating treatment under an atmosphere comprising hydrogen under atmospheric pressure, wherein said non-single crystal semiconductor film comprising silicon is crystallized by the irradiation of said light.

2. The method of claim 1 wherein said light comprises a light pulse having a pulse width of 1$\mu$ second or shorter.

3. The method of claim 1 wherein said oxidizing atmosphere comprises a gas containing oxygen.

4. The method of claim 1 wherein said light is laser light or other light as strong as laser light.

5. The method of claim 1 wherein said heating treatment under an atmosphere comprising hydrogen is carried out at a temperature of 350° C.

6. The method of claim 1 wherein the irradiation of said light is carried out while heating said semiconductor film at a temperature of 200 to 500° C.

7. A method of manufacturing a semiconductor device comprising the steps of:

crystallizing a non-single crystal semiconductor film comprising silicon by irradiating a light to said non-single crystal silicon film under an oxidizing atmosphere;

forming a film comprising silicon oxide on said silicon film by vapor phase growth;

subjecting said non-single crystal silicon film to heating treatment under an atmosphere comprising hydrogen;

forming a silicon oxide film on said silicon film after said heating treatment.

8. The method of claim 7 wherein said oxidizing atmosphere comprises a gas containing oxygen.

9. The method of claim 7 wherein said heating treatment under an atmosphere comprising hydrogen is carried out under atmospheric pressure.

10. The method of claim 7 wherein said light is laser light or other light as strong as laser light.

11. The method of claim 7 wherein said heating treatment under an atmosphere comprising hydrogen is carried out at a temperature of 350° C.

12. The method of claim 7 wherein the irradiation of said light is carried out while heating said silicon film at a temperature of 200 to 500° C.

13. A method of manufacturing a semiconductor device, using a processing system having a first chamber for a light processing, a second chamber for heat treatment under an atmosphere comprising hydrogen, a third chamber for forming a film, and a common chamber connected with said first, second and third chambers, said method comprising:

irradiating a light to a non-single crystal semiconductor film comprising silicon under an oxidizing atmosphere in said first chamber to crystallize said non-single crystal semiconductor film and to oxidize a surface of said non-single crystal semiconductor film;

subjecting said semiconductor film to heating treatment under an atmosphere comprising hydrogen in said second chamber; and forming a film comprising a material selected from the group consisting of silicon oxide and silicon nitride over said silicon film in said third chamber, wherein said semiconductor film can be transferred from one of said first, second and third chambers to another of said first, second and third chambers through said common chamber.

14. The method of claim 13 wherein said oxidizing atmosphere comprises a gas containing oxygen.

15. The method of claim 13 wherein said heating treatment under an atmosphere comprising hydrogen is carried out under atmospheric pressure.

16. The method of claim 13 wherein said light is laser light or other light as strong as laser light.

17. The method of claim 13 wherein said heating treatment under an atmosphere comprising hydrogen is carried out at a temperature of 350° C.

18. The method of claim 13 wherein the irradiation of said light is carried out while heating said silicon film at a temperature of 200 to 500° C.

19. A method of manufacturing a semiconductor device comprising the steps of:

irradiating a light having a rectangular form to a non-single crystal semiconductor film provided formed over a substrate while moving said substrate to crystallize said non-single crystal semiconductor film; and subjecting said semiconductor film to heating treatment under an atmosphere comprising hydrogen, wherein the irradiation of said light is carried out in an oxidizing atmosphere.

20. The method of claim 19 wherein said non-single crystal semiconductor film comprises amorphous silicon.

21. The method of claim 19 wherein said light is laser light.

22. The method of claim 19 wherein the irradiation of said light is carried out while heating said substrate at a temperature of 200 to 500° C.

23. The method of claim 19 wherein said oxidizing atmosphere comprises oxygen or nitrogen oxide.

24. The method of claim 19 wherein said light is KrF excimer laser light, XeCl excimer laser light or XeF excimer laser light.

25. The method of claim 19 wherein size of said substrate is 300 mm by 400 mm, and a cross section of said light is shaped into a rectangular form measuring 2 mm×350 mm to crystallize said whole surface of said non-single crystal semiconductor film during the irradiation of said light.

26. The method of claim 19 wherein said semiconductor film comprises amorphous silicon.

27. The method of claim 19 wherein said heating treatment under an atmosphere comprising hydrogen is carried out under atmospheric pressure.

28. A light processing method, using a processing system having a first chamber for a light processing, a second chamber for neutralizing dangling bonds, a third chamber for forming a film, and a common chamber connected with said first, second and third chambers, said method comprising:

irradiating a light to a non-single crystal semiconductor film comprising silicon under an oxidizing atmosphere in said first chamber to crystallize said non-single crystal semiconductor film and to oxidize or nitride a surface of said non-single crystal semiconductor film;

forming a film comprising a material selected from the group consisting of silicon oxide and silicon nitride on said semiconductor film in said third chamber; and neutralizing dangling bonds formed in or in the vicinity of an interface between said semiconductor film and said film comprising a material selected from the group consisting of silicon oxide or silicon nitride in said second chamber to decrease state density by heating in a hydrogen containing atmosphere, wherein said semiconductor film can be transferred from one of said first second and third chambers to another of said first, second and third chambers through said common chamber.

29. The method of claim 28 wherein said neutralizing step is carried out under atmospheric pressure.

30. The method of claim 28 wherein said light is laser light or other light as strong as laser light.

31. The method of claim 28 wherein the irradiation of said light is carried out while heating said semiconductor film at a temperature of 200 to 500° C.

32. A light processing method comprising the steps of:

irradiating a laser light to a semiconductor film under oxidizing atmosphere to anneal or crystallize said semiconductor film;

forming an oxide film on said semiconductor film; and subjecting said semiconductor film to heating treatment under an atmosphere comprising hydrogen under atmospheric pressure.

\* \* \* \* \*